(12) United States Patent
Inoue et al.

(10) Patent No.: US 7,417,273 B2
(45) Date of Patent: Aug. 26, 2008

(54) IMAGE SENSOR WITH EMBEDDED PHOTODIODE REGION AND FABRICATION METHOD THEREOF

(75) Inventors: Tadao Inoue, Kawasaki (JP); Katsuyoshi Yamamoto, Kawasaki (JP); Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 311 days.

(21) Appl. No.: 11/248,320

(22) Filed: Oct. 13, 2005

(65) Prior Publication Data
US 2006/0208285 A1    Sep. 21, 2006

(30) Foreign Application Priority Data
Mar. 17, 2005    (JP) .............................. 2005-77237

(51) Int. Cl.
*H01L 31/062* (2006.01)
*H01L 31/113* (2006.01)
(52) U.S. Cl. ................ 257/292; 257/291; 257/E27.133; 257/E25.032
(58) Field of Classification Search ................. 257/291, 257/292, E27.133, E25.032
See application file for complete search history.

(56) References Cited

U.S. PATENT DOCUMENTS

| | | | |
|---|---|---|---|
| 5,698,874 A | 12/1997 | Hayashi | |
| 6,433,373 B1 | 8/2002 | Lee et al. | |
| 6,504,196 B1* | 1/2003 | Rhodes | 257/292 |
| 6,610,557 B2* | 8/2003 | Lee et al. | 438/87 |
| 2002/0140009 A1* | 10/2002 | Lee et al. | 257/291 |
| 2004/0173824 A1* | 9/2004 | Nagasaki et al. | 257/255 |
| 2005/0237405 A1* | 10/2005 | Ohkawa | 348/308 |
| 2007/0030372 A1* | 2/2007 | Inagaki et al. | 348/308 |
| 2008/0011942 A1* | 1/2008 | Hong et al. | 250/214.1 |

FOREIGN PATENT DOCUMENTS

| | | |
|---|---|---|
| JP | 11-233748 | 8/1999 |
| JP | 2002-016243 A | 1/2002 |
| JP | 2003-282857 | 10/2003 |

* cited by examiner

*Primary Examiner*—Ngan Ngo
(74) *Attorney, Agent, or Firm*—Westerman, Hattori, Daniels & Adrian, LLP.

(57) ABSTRACT

An image sensor in which a plurality of pixels having at least a photodiode, a reset transistor, and source follower transistor are formed, wherein each pixel comprises an electrical-charge transfer gate transistor between the photodiode and reset transistor, and a floating diffusion region constituting a node connecting the reset transistor and transfer gate transistor is connected to the gate of the source follower transistor. Further, a photodiode region is embedded below a well region in which the reset transistor and source follower transistor of each pixel are formed. In addition, the photo diode region is not formed below at least a partial region of the floating diffusion region.

26 Claims, 27 Drawing Sheets

FIRST EMBODIMENT

FIFTH EMBODIMENT

DETAILED DIAGRAM:
PD AND WIRING LAYER

DETAILED DIAGRAM : STI / PD / POLY

ALL LAYER DIAGRAM
(EXCLUDING THIRD METAL LAYER)

Fig. 17
SIXTH EMBODIMENT
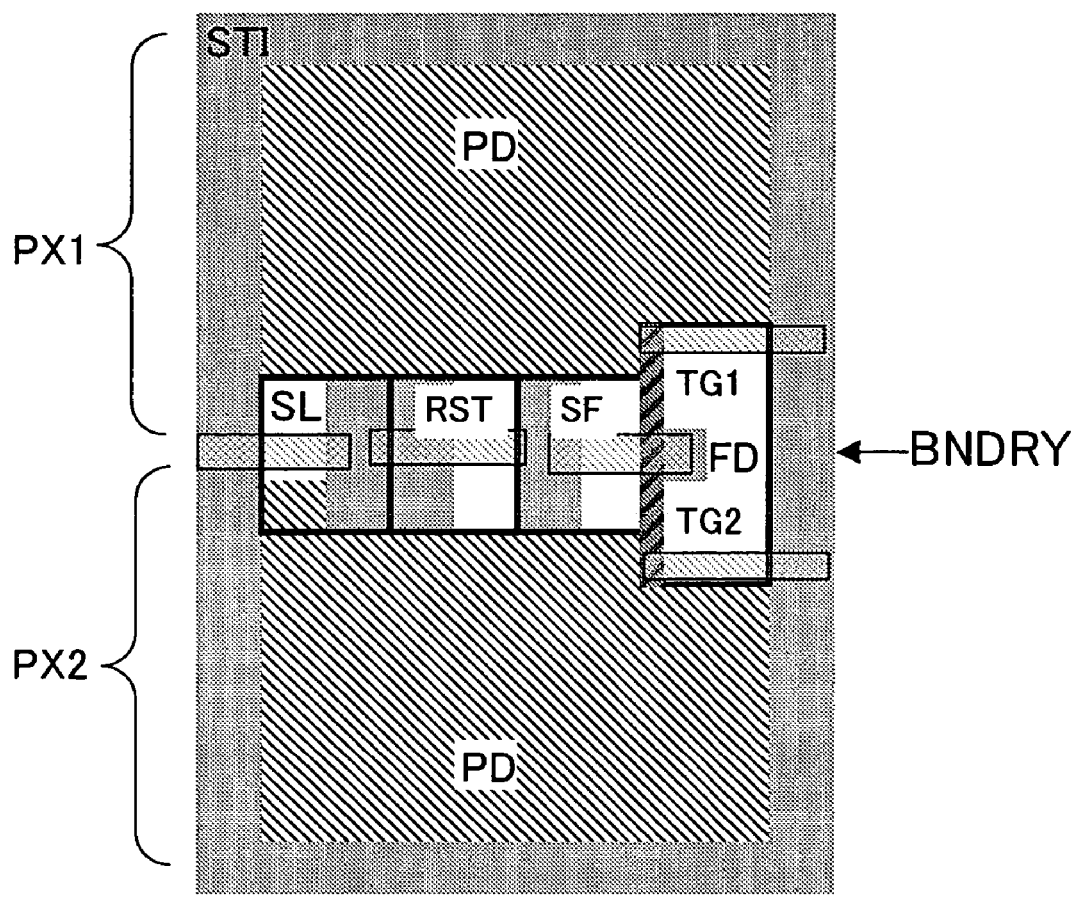

DETAILED DIAGRAM :
PD AND WIRING LAYER

DETAILED DIAGRAM : STI/PD/Poly

ALL LAYER DIAGRAM
(EXCLUDING THIRD METAL LAYER)

ELEVENTH EMBODIMENT

TWELFTH EMBODIMENT

THIRTEENTH EMBODIMENT

FIFTEENTH EMBODIMENT

IMAGE SENSOR WITH EMBEDDED PHOTODIODE REGION AND FABRICATION METHOD THEREOF

CROSS-REFERENCE TO RELATED APPLICATIONS

This application is based upon and claims the benefit of priority from the prior Japanese Patent Application No. 2005-077237, filed on Mar. 17, 2005, the entire contents of which are incorporated herein by reference.

BACKGROUND OF THE INVENTION

1. Field of the Invention

The present invention relates to an image sensor with an embedded photodiode region and the fabrication method thereof and, more particularly, to an image sensor in which a photodiode region is embedded to extend below a transistor formation region and the fabrication thereof.

2. Description of the Related Art

Image sensors include a CCD (Charge Coupled Device), an APS (Active Pixel Sensor) and a CMOS image sensor as a representative example of APS. CCDs are used in video cameras and so forth and CMOS image sensors are used in low-priced digital still cameras and so forth. Of the two sensors, the CMOS image sensor can be fabricated by means of a CMOS process and has low fabrication costs and is used in battery drive devices such as cellular phones or portable information terminals on account of the small amount of electric power consumed in comparison with CCD image sensors.

A CMOS image sensor comprises a photodiode as an O/E (Opto/Electric) conversion element and extracts incident light intensity as an electrical signal by reading the amount of electrical charge that has accumulated in the photodiode by means of a source follower transistor or the like. CMOS image sensors that are already used are three-transistor-type image sensors that comprise a photodiode, reset transistor, source follower transistor and select transistor. Further, recently, a four-transistor type APS in which a transfer gate transistor is provided between the photodiode and reset transistor has been proposed.

In a four-transistor type APS, a floating diffusion (FD) consisting of a floating diffusion layer is provided at the point of connection between the transfer gate transistor and reset transistor. Further, after the floating diffusion has been brought to the reset level by means of the reset transistor, the electrical charge that has accumulated in the photodiode region is transferred to the floating diffusion and the potential is changed by causing the transfer gate transistor to conduct, and the change in the potential is transferred to the signal line via the source follower transistor. A signal from which noise has been removed can be extracted by detecting the difference between the potential during resetting of the floating diffusion and the potential during the transfer of electrical charge from the photodiode.

Three-transistor-type and four-transistor-type APS appear in Japanese Patent Application Laid Open No. 2002-16243 (published on Jan. 18, 2002), for example.

In addition, a five-transistor-type APS to which an overflow drain transistor is added in order to prevent overflow of the photodiode has also been proposed. By controlling the overflow drain transistor, the integral start time of the photodiode can be controlled and the adoption of a global shutter system is made possible.

Thus, the number of in-pixel transistors increases with an increasingly high performance and the ratio of the surface area to the pixel area of the photodiode region drops, causing a drop in the so-called aperture ratio. In order to solve this problem, sharing of elements such as transistors between adjoining pixels has been proposed.

In addition, in order to prevent a drop in the aperture ratio, a constitution in which a photodiode region is embedded below an in-pixel transistor formation region has also been proposed. For example, such a constitution appears in Japanese Patent Application Laid Open No. 2002-16243 (published on Jan. 18, 2002).

FIG. 1 is a cross-sectional view of the CMOS image sensor that appears in Japanese Patent Application Laid Open No. 2002-16243 (published on Jan. 18, 2002). A gate electrode 55 of a transfer transistor TG, a gate electrode 58 of a reset transistor, and a gate electrode 61 of a source follower transistor are formed via gate oxide films 56, 63, and 64 on a P-type epitaxial layer 52 that is formed on a P-type semiconductor substrate 51, and source and drain regions 57, 59, 60, and 62 are provided on both sides of the gate electrodes. Further, a high-concentration N-type photodiode region 53 is formed in the depth direction from the surface of the epitaxial layer 52 and the photodiode region 53 is embedded to extend below the transfer gate transistor, reset transistor, and source follower transistor. Further, the photodiode region 53 is embedded spaced apart from the surface insulation film 54 by a high-concentration P+ region formed at the surface of the epitaxial layer 52 so that a dark current caused by a leak current from the insulation film 54 can be suppressed.

Thus, in the case of the CMOS image sensor that appears in Japanese Patent Application Laid Open No. 2002-16243, a drop in the aperture ratio is prevented by embedding a photodiode region in overlapping fashion below the in-pixel transistor formation region, whereby the light sensitivity is increased.

SUMMARY OF THE INVENTION

However, the CMOS image sensor that appears in Japanese Patent Application Laid Open No. 2002-16243 has an N-type photodiode region 53 embedded below the whole region of the in-pixel transistor formation region. More particularly, because the N-type photodiode region 53 is formed directly below the transfer gate transistor TG and floating diffusion 57, it is difficult to keep the threshold voltage Vth of the transfer gate transistor TG low and the junction capacitance of the floating diffusion 57 increases. This is because, in order to electrically isolate the embedded N-type photodiode region 53 from the surface N-type source and drain regions, it is necessary to increase the impurity concentration of the P-type epitaxial layer 52 between the embedded N-type photodiode region 53 and the surface N-type source and drain regions. As a result of the high-concentration P-type epitaxial layer, the concentration of the channel region of the transfer gate transistor increases and the threshold voltage rises. When the threshold voltage of the transfer gate transistor TG rises, the charge transfer efficiency from the photodiode region 53 to the floating diffusion 57 drops and brings about a drop in sensitivity. Further, because the concentration of the P-type epitaxial layer 52 in which the N-type floating diffusion 57 is formed is high, the junction capacitance of the floating diffusion 57 rises. When the junction capacitance rises, the proportion of the change in the voltage of the floating diffusion region corresponding with the transferred electrical charge from the photodiode region 53 is small, which brings about a drop in sensitivity.

In addition, because the N-type photodiode region 53 is embedded below the floating diffusion region 57 in the CMOS image sensor that appears in Japanese Patent Application Laid Open No. 2002-16243, this CMOS image sensor is not suited to a constitution that raises the aperture ratio by sharing the transfer gate transistor, reset transistor, and source follower transistor and so forth between adjoining pixels. That is, in a transistor-sharing type CMOS image sensor, the photodiode regions of adjoining pixels share the floating diffusion region 57. However, when the photodiode region 53 of one pixel is provided below the floating diffusion region 57, the photodiode region of another pixel cannot be provided there and the shapes of the photodiode regions of the two pixels are not the same and the shape of the photodiode regions is not uniform from one pixel to the next. This non-uniformity causes inconsistencies in the detection signal of each pixel and is not preferable.

Therefore, an object of the present invention is to provide a CMOS image sensor in which the substantial aperture ratio is increased and the light sensitivity is raised, as well as a fabrication method thereof.

In order to achieve the above object, a first aspect of the present invention is an image sensor in which a plurality of pixels having at least a photodiode, a reset transistor, and source follower transistor are formed, wherein each pixel comprises an electrical-charge transfer gate transistor between the photodiode and reset transistor, and a floating diffusion region constituting a node connecting the reset transistor and transfer gate transistor is connected to the gate of the source follower transistor. Further, a photodiode region is embedded below a well region in which the reset transistor and source follower transistor of each pixel are formed. In addition, the photodiode region is not formed below at least a partial region of the floating diffusion region.

According to this constitution, the photodiode region is formed below the well region where the reset transistor and source follower transistor are formed. Therefore, the area of the photodiode region can be increased and the aperture ratio can be raised. In addition, a photodiode region is not formed in at least a partial region below the well region where the floating diffusion region is formed. As a result, there is no need to increase the impurity concentration of the well region so that the junction capacitance of the floating diffusion region can be lower and the voltage variation to the electrical charge can be increased, whereby the light detection sensitivity can be increased.

According to the first aspect of the present invention, in a preferred embodiment, a photodiode region is not formed below at least a partial region of the transfer gate transistor region. For this reason, there is no need to raise the impurity concentration of the well region so that the threshold value voltage of the transfer gate transistor can be lowered and the charge transfer efficiency can be increased.

In order to achieve the above object, a second aspect of the present invention is an image sensor comprising a plurality of pixels each having at least a photodiode, a reset transistor, and a source follower transistor, wherein each pixel comprises an electrical-charge transfer gate transistor between the photodiode and reset transistor, and a floating diffusion region constituting a node connecting the reset transistor and transfer gate transistor is connected to the gate of the source follower transistor. Further, a photodiode region is embedded below a well region in which the reset transistor and source follower transistor of each pixel are formed. In addition, adjoining first and second pixels share at least a reset transistor, a floating diffusion region, and a source follower transistor and the photodiode regions of the first and second pixels are not formed below at least a partial region of the shared floating diffusion region.

As a result of this constitution, the formation of the photodiode regions that are connected via the respective transfer gate transistors to the shared floating diffusion region can be the same for the first and second pixels, whereby the detection signal between pixels can be made uniform.

In the case of the second aspect, in the case of the preferred embodiment, a light-shielding film is formed on the shared floating diffusion region. The photodiode region is not formed below the floating diffusion region and therefore a drop in light sensitivity does not occur even when the light-shielding film is formed on the floating diffusion region. In addition, by cutting the incident light that is incident on the floating diffusion region, the addition of noise to the detection signal can be suppressed.

According to the present invention, the substantial aperture ratio of the pixel in the image sensor increases and the light sensitivity can be raised.

BRIEF DESCRIPTION OF THE DRAWINGS

FIG. 17 is a layout diagram of pixels of a sixth embodiment;

DESCRIPTION OF THE PREFERRED EMBODIMENTS

Embodiments of the present invention will be described hereinbelow with reference to the drawings. However, the technological scope of the present invention is not limited to these embodiments and instead covers the items appearing in the claims and any equivalents thereof.

Figure 1:
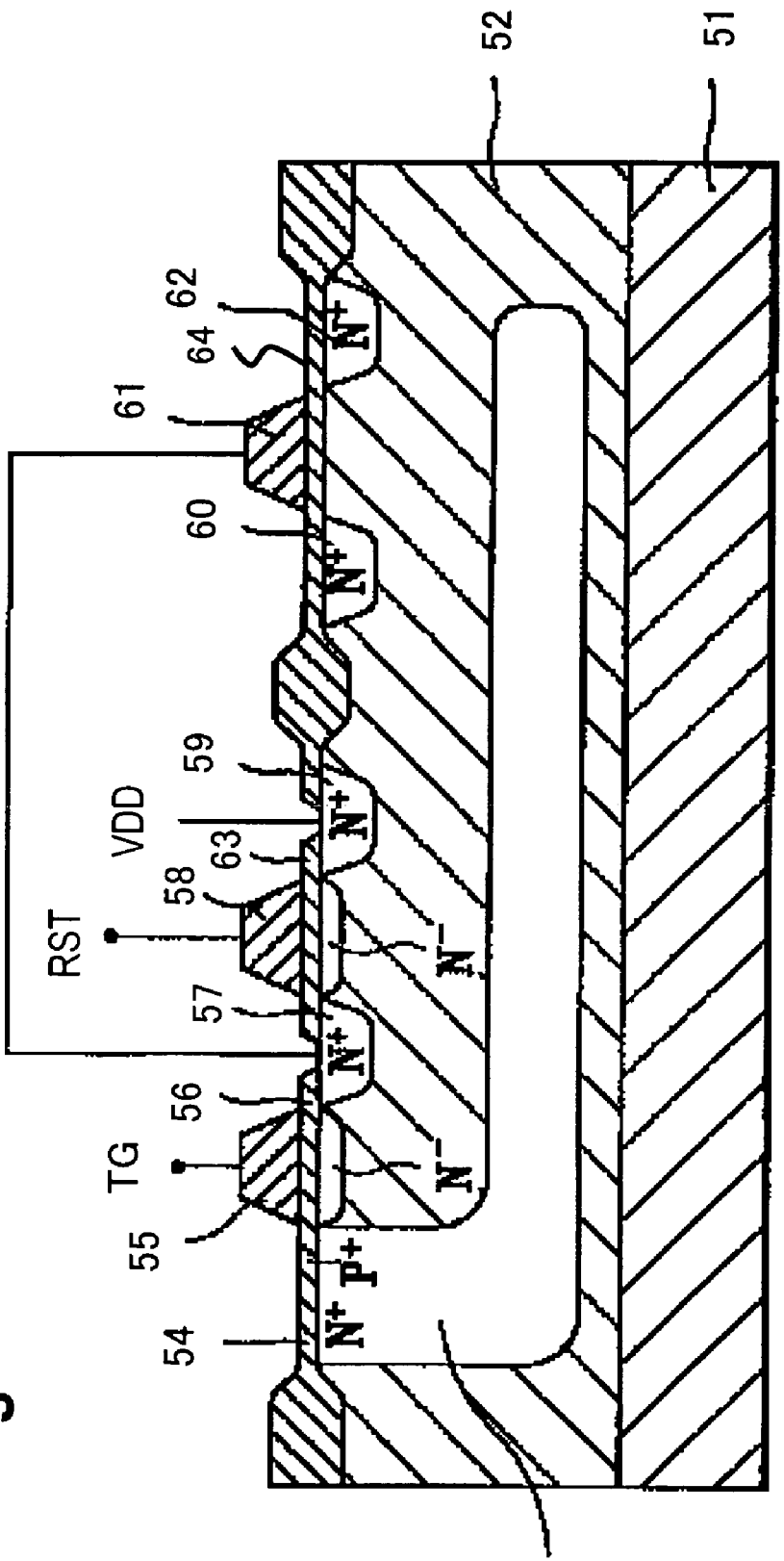
FIG. 1 is a cross-sectional view of the CMOS image sensor that appears in Japanese Patent Application Laid Open No. 2002-16243.
Figure 2:
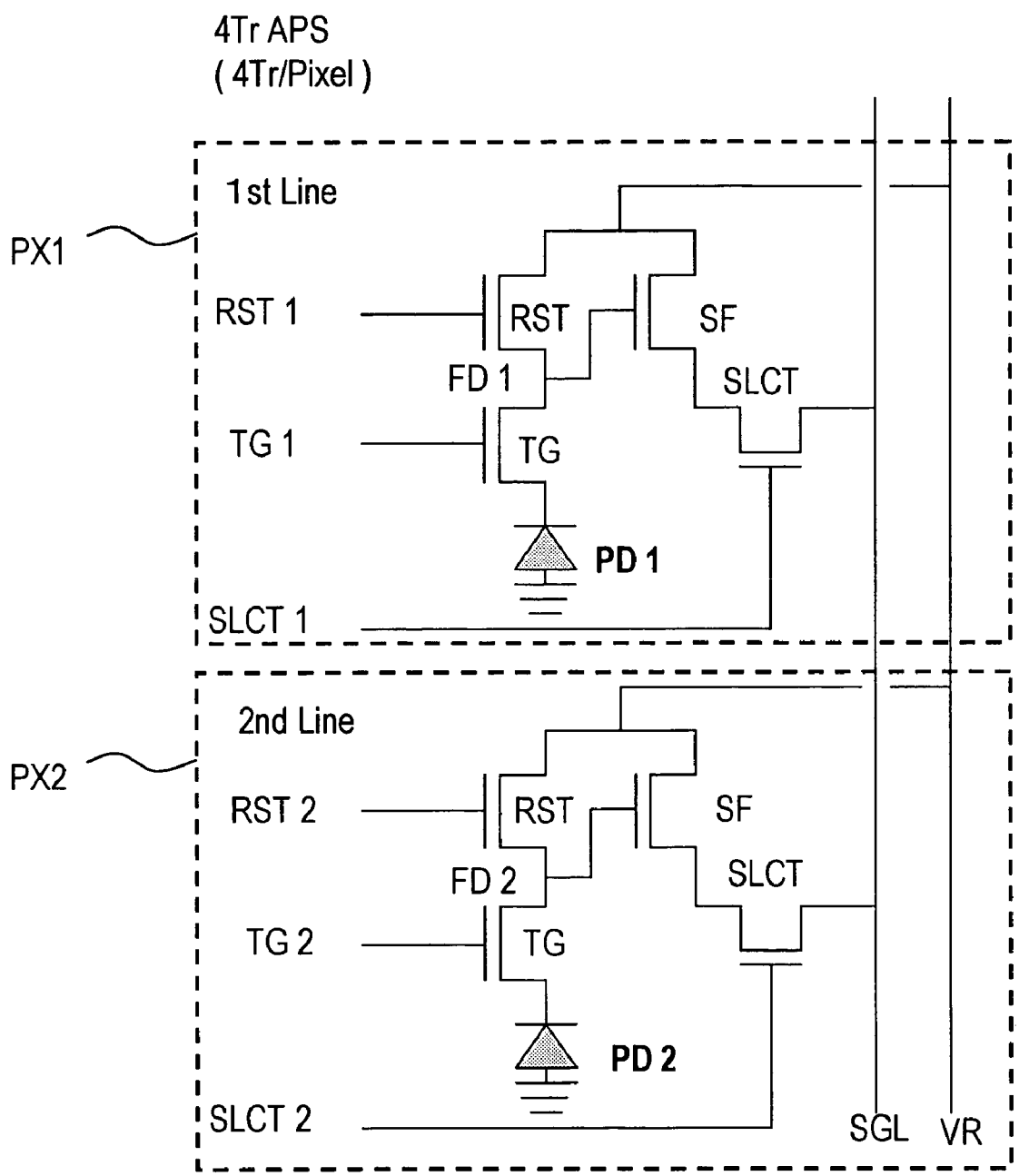
FIG. 2 is a circuit diagram of a four-transistor-type APS.

FIG. 2 is a cross-sectional view of a four-transistor-type APS. FIG. 2 shows two pixels PX1 and PX2 arranged in two rows and one column. Pixels PX1 and PX2 are constituted by the photodiodes PD1 and PD2 respectively and four transistors. The four transistors are a reset transistor RST, which is connected to a reset voltage VR, a source follower transistor SF, which is similarly connected to the reset voltage VR, a select transistor SLCT between the source follower transistor SF and signal line SGL, and a transfer gate transistor TG, which is provided between the reset transistor RST and the photodiode PD. Further, the transfer gate transistor TG is connected to the cathode of the photodiode PD. Further, the node connecting the reset transistor RST and the transfer gate transistor TG is the floating diffusion FD1 and FD2 respectively and is connected to the gate of the source follower transistor SF.

Figure 3:
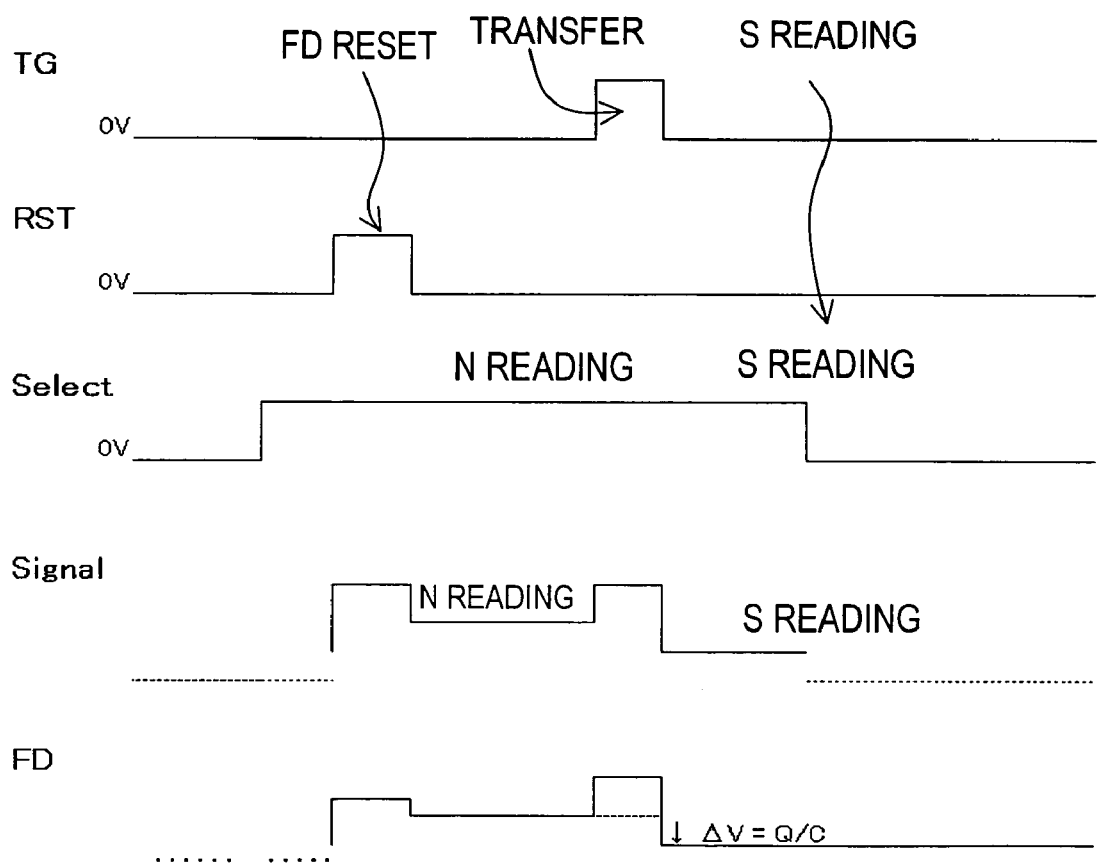
FIG. 3 is an operation waveform of a four-transistor-type APS.

FIG. 3 is an operation waveform diagram for a four-transistor-type APS. The description assumes a case where pixel PX1 is selected. First, in a state where the select transistor SLCT is made to conduct by driving a select line SLCT1 (Select in FIG. 3) to the H level, the reset transistor RST is made to conduct by driving the reset line RST1 to the high level and the floating diffusion FD1 is reset to the reset voltage level VR. The reset level is outputted to the signal line SGL (Signal in FIG. 3) via the source follower transistor SF and select transistor SLCT as a noise signal. Thereafter, when the transfer gate transistor TG conducts, the electrical charge consisting of electrons that have accumulated in the cathode of the photodiode FD is transferred to the floating diffusion FD1 and the voltage of the floating diffusion FD drops. The voltage drop ΔV is produced by dividing the transferred electrical charge amount Q by the parasitic capacitance C of the floating diffusion FD. The level of the reduced floating diffusion FD is outputted to the signal line SGL as a detection signal. The output circuit (not shown) detects the level difference ΔV between the noise signal and the detection signal and is outputted as the pixel light intensity signal.

Thus, in order to increase the detected light intensity signal ΔV thus detected, it is necessary to increase the O/E conversion efficiency by increasing the amount of light incident on the photodiode and reduce the parasitic capacitance C of the floating diffusion FD.

Figure 4:
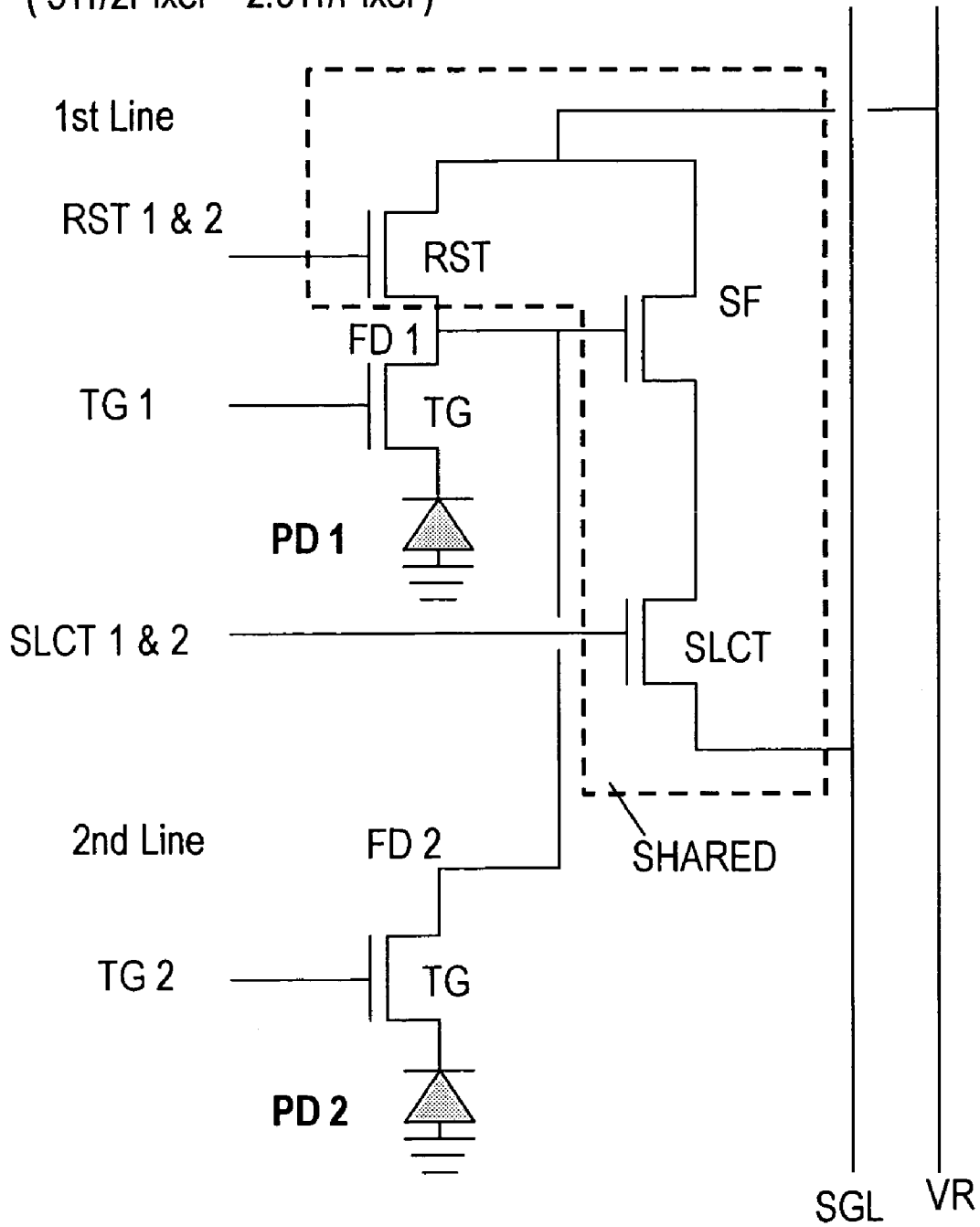
FIG. 4 is a circuit diagram of a shared four-transistor-type APS.

FIG. 4 is a circuit diagram of a shared four-transistor-type APS. Four transistors are provided for each pixel in the four-transistor-type APS shown in FIG. 2. For this reason, the aperture ratio constituting the ratio of the photodiode formed surface area in relation to the pixel surface area drops. In order to solve this problem, in the sensor in FIG. 4, the reset transistor RST, source follower transistor SF, and select transistor SLCT are shared by adjoining pixels. If the three transistors are formed in a shared region SHARED, five transistors may be provided for two pixels, i.e. 2.5 transistors per pixel, whereby a drop in the aperture ratio can be suppressed.

The operation of the shared four-transistor-type APS is similar to that in FIG. 3 and, in a state where the select transistor SLCT is made to conduct, the floating diffusions FD1 and FD2 are reset by means of the reset transistor RST, the noise signal is read in that state, and then the detection signal is read by causing one transfer gate transistor TG of the photodiode FD1 to conduct by means of the transfer gate signal TG1. In addition, the same operation is repeated in order to read one more pixel signal. That is, three shared transistors are each used in the reading of the signal of each pixel.

First Embodiment

Figure 5:
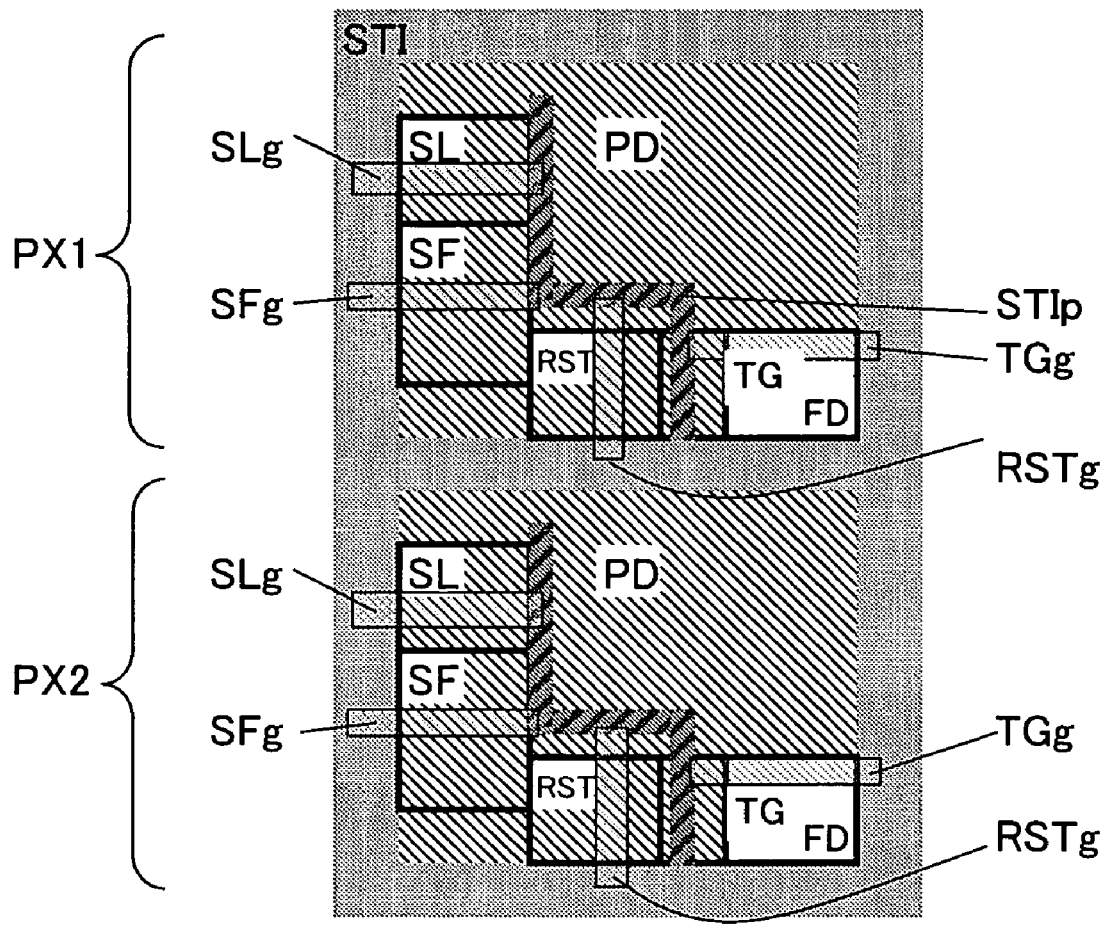
FIG. 5 is a layout diagram of pixels of a first embodiment.

FIG. 5 is a layout diagram of pixels of the first embodiment. The first embodiment corresponds with the four-transistor-type APS in FIG. 2. FIG. 5 shows a layout with two pixels PX1 and PX2 at the top and bottom respectively. Each of the pixels PX1 and PX2 are isolated by an isolation trench structure STI consisting of a shallow trench isolation (STI), for example, and each pixel is provided with a floating diffusion region FD, a transfer gate transistor TG, a reset transistor RST, a source follower transistor SF, and a select transistor SL (abbreviated as 'SL' in the layout). Each transistor comprises a gate electrode TGg, RSTg, SFg, and SLg, the source and drain regions are shown with a bold frame and the in-pixel isolation trench structure is shown as 'STIp'. Further, the source of the transfer gate transistor TG is a photodiode region PD. The drain of the same transistor TG corresponds to the floating diffusion region FD.

In addition, in the respective pixels PX1 and PX2, the photodiode region PD is formed in the vicinity of the substrate surface where the floating diffusion region FD and transistors are not formed, and the photodiode region PD is embedded in a region excepting below the floating diffusion region FD and transfer gate transistor TG. That is, the photodiode region PD is also embedded below the reset transistor RST, source follower transistor SF, and select transistor SL. In the layout diagram, the photodiode region PD is shown by means of a diagonally left pattern. The cross-sectional structure thereof is detailed together with the second embodiment (described subsequently) In the first embodiment, the in-pixel photodiode region PD is embedded below the reset transistor RST, source follower transistor SF, and select transistor SL in addition to being embedded in the vicinity of the substrate surface where transistors and so forth are not formed, so that the aperture ratio can therefore be increased. In addition, the diagonally left pattern PD is not provided in the TG or FD. That is, the embedded photodiode region PD is not formed below the floating diffusion region FD and transfer gate transistor TG. Therefore, the impurity concentration of the P-type well where the floating diffusion region FD and transistor TG are formed can be reduced. As a result, the threshold voltage of the transfer gate transistor TG can be kept low and the junction capacitance of the floating diffusion region FD can be kept small.

Second Embodiment

Figure 6:
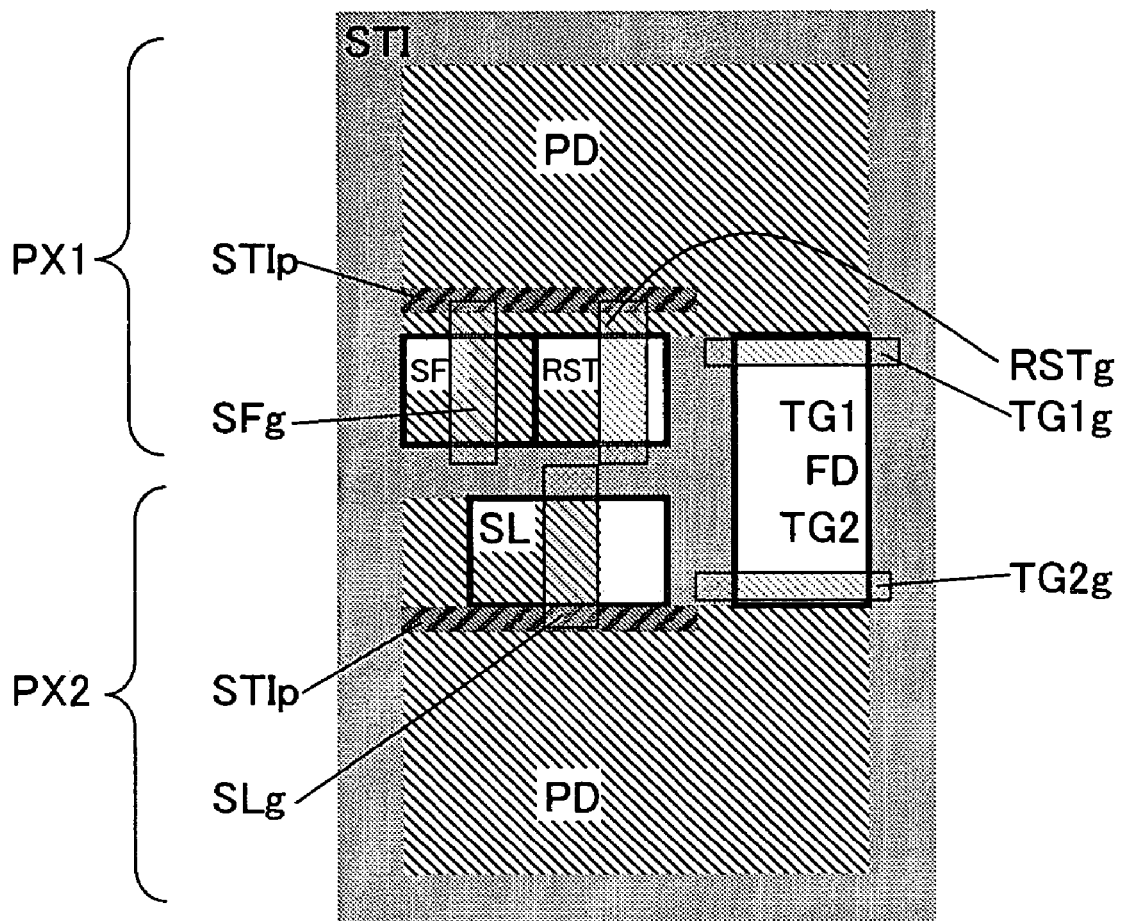
FIG. 6 is a layout diagram of pixels of a second embodiment.

FIG. 6 is a layout diagram of pixels of the second embodiment. The second embodiment corresponds with the shared four-transistor-type APS in FIG. 4. FIG. 6 also shows a layout with two pixels PX1 and PX2 at the top and bottom respectively. Each of the pixels PX1 and PX2 are isolated by an isolation trench structure STI consisting of a shallow trench isolation, for example. Further, the two pixels PX1 and PX2 share a floating diffusion region FD, a reset transistor RST, a source follower transistor SF, and a select transistor SL and both pixels comprise a transfer gate transistor TG on the sides above and below the shared floating diffusion region FD. Further, the shared floating diffusion region FD is disposed above the boundary between the two pixels PX1 and PX2.

So too in FIG. 6, each transistor comprises gate electrodes TGg, RSTg, SFg, and SLg. The source and drain regions thereof are shown with a bold frame and the in-pixel isolation trench structure is shown as STIp. The source of the transfer gate transistor TG is a photodiode region PD. The drain of the same transistor TG corresponds to the floating diffusion region FD and constitutes a node shared by two pixels.

So too in the second embodiment, the photodiode region PD is formed in the vicinity of the substrate surface in a part where transistors and so forth are not formed and also below the source follower transistor SF, part of the reset transistor RST, and part of the select transistor SL. However, the photodiode region PD is not embedded below the floating diffusion region FD, the transfer gate transistors TG1 and TG2, the source region of the reset transistor RST and the drain region of the select transistor SL. Because the region PD is not embedded, the junction capacitance of the floating diffusion region FD can be kept low and the threshold voltage of the transfer gate transistors TG1 and TG2 can be kept low. In addition, the photodiode region FD is not formed below the source region of the reset transistor RST that is connected to the floating diffusion region FD. Further, in order to make the shape of the photodiode regions PD in the upper and lower pixels the same, the photodiode region FD is not formed below the source region of the select transistor SL in pixel PX2 either. Further, noise is removed by forming a light-shielding film that blocks incident light on the source region of the shared reset transistor RST and drain region of the select transistor SL. The light-shielding film is shown in the subsequent detailed diagram.

Figure 7C:
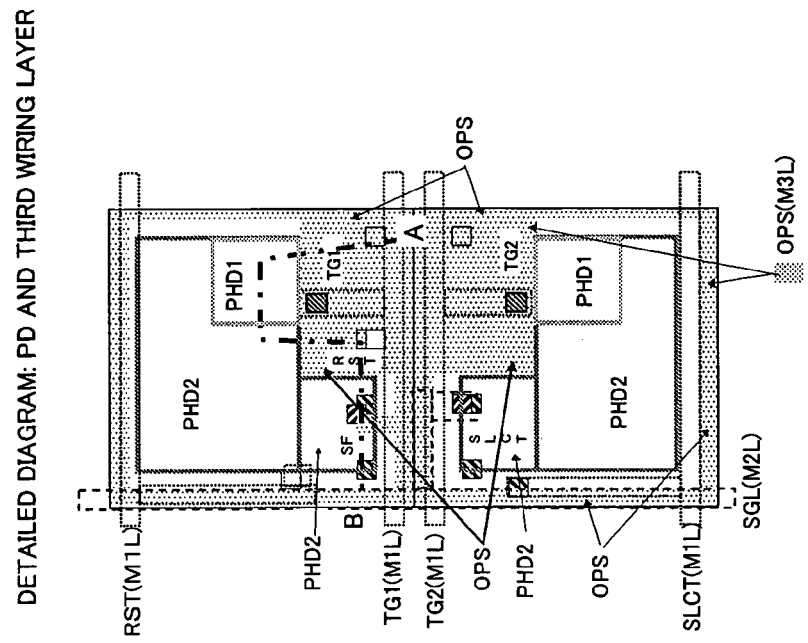
FIG. 7 is a detailed layout diagram of pixels of the second embodiment.
Figure 7B:
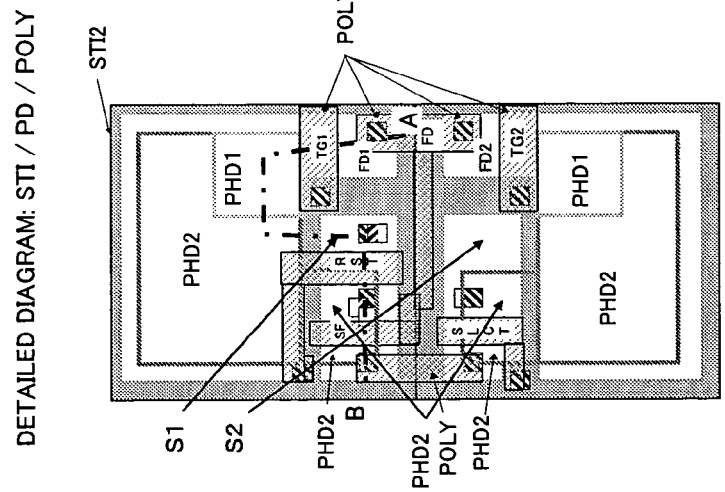
Figure 7A:
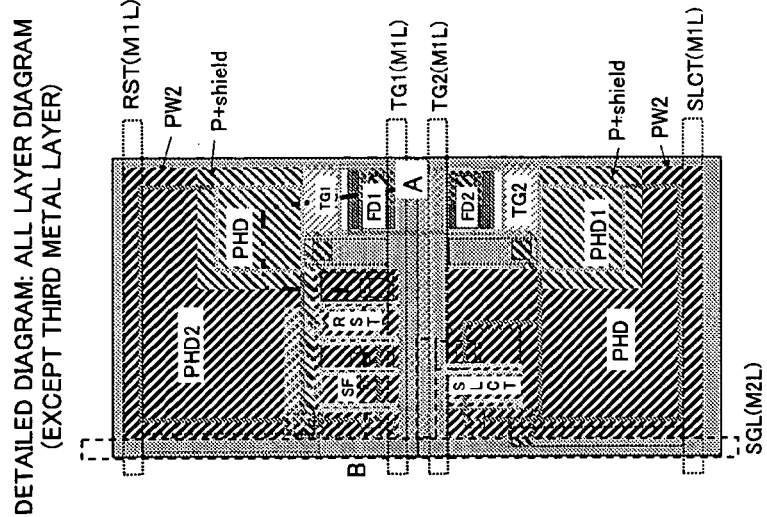
Figure 8:
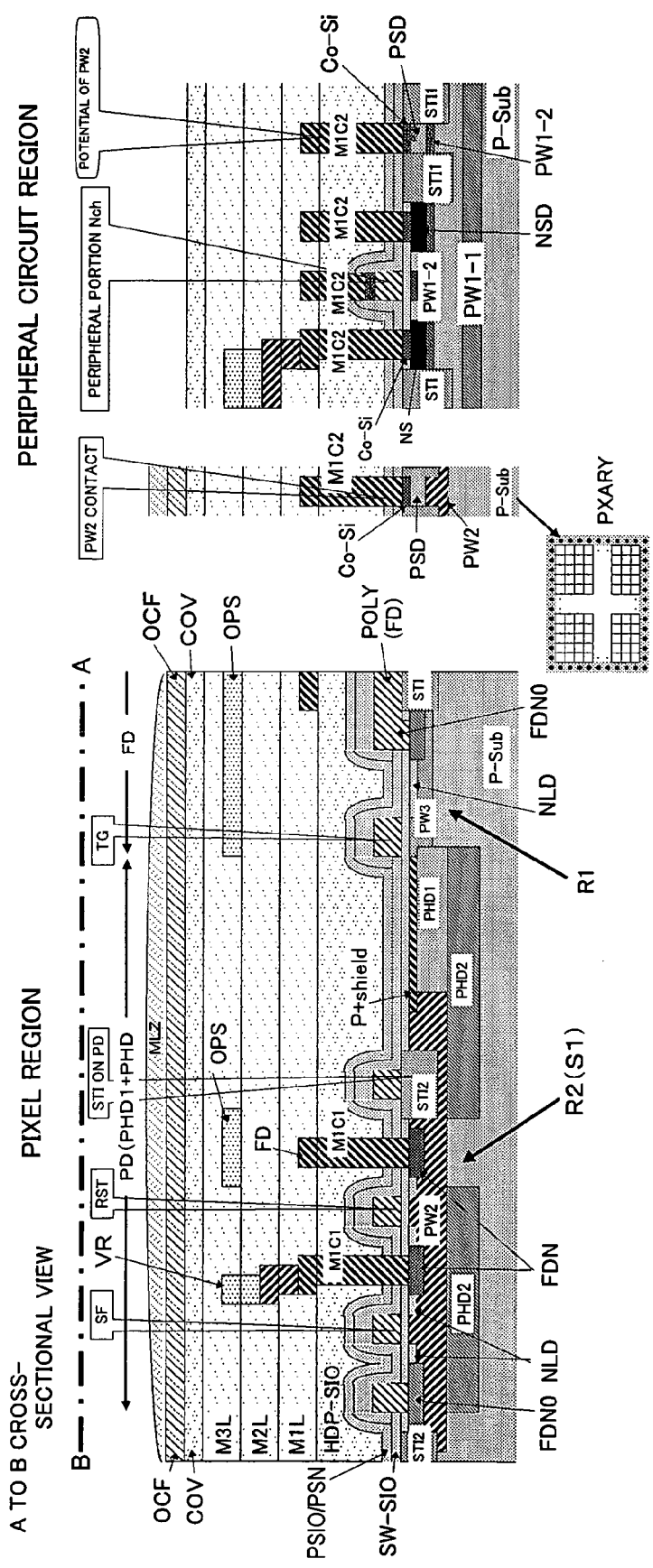
FIG. 8 is a detailed cross-sectional view of pixels of the second embodiment.

FIG. 7 is a detailed layout diagram of pixels of the second embodiment. Further, FIG. 8 is a cross-sectional view thereof. FIG. 7A shows a layout diagram showing a structure with all the layers except for the third metal layer. FIG. 7B is a layout diagram showing an isolation trench structure, photodiode region PD, and the polysilicon gate of each transistor. FIG. 7C shows a layout diagram showing the photodiode region PD and the third metal layer M3L. Further, FIG. 8 shows a cross-sectional view of pixels on the left, a cross-sectional view of the periphery of the pixel array PXARY in the middle, and a cross-sectional view of a peripheral circuit on the right.

A cross-sectional view along the single-dot chain line A-B in FIG. 7 is shown on the left of FIG. 8. The layout diagram in FIG. 7 is substantially the same as FIG. 6, only the floating diffusion regions FD1 and FD2 in the respective pixels are provided in two upper and lower pixels and differ in being connected by means of a polysilicon layer POLY. The structure along the single-dot chain line A-B will be described below.

In the cross-sectional view of FIG. 8, point A is located above the pixel-side isolation trench structure STI2 and, thereafter, the polysilicon layer POLY is connected to the N-type contact region FDNO of the floating diffusion region FD, and the N-type lightly doped region NLD in the third P-type well region PW3, the polysilicon gate electrode of the transfer gate transistor TG, the first photodiode region PHD1, and the second photodiode region PHD2 are formed. Here, as shown in FIG. 8, the photodiode region PD comprises an N-type first photodiode region PHD1 that is formed in the vicinity of the substrate surface and extends in the depth direction and an N-type second photodiode region PHD2 that is deeply buried in the substrate. Further, as shown in FIG. 7, the second photodiode region PHD2 extends over the whole area in the pixel except for a partial region. More particularly, the second region PHD2 is provided so as to extend below the in-pixel source follower transistor SF, below the select transistor SLCT, and below a region excluding the source region of the reset transistor RST respectively.

The second photodiode region PHD2 is not provided below the in-pixel floating diffusion regions FD1 and FD2 or below the transfer gate transistors TG1 and TG2 (region R1 in FIG. 8), nor below the source region S1 (region R2 in FIG. 8) of the reset transistor RST. The source region S1 of the reset transistor RST is connected to the floating diffusion region FD via M1C1 and therefore non-overlap of the second region PHD2 is desirable. Accordingly, the second photodiode region PHD2 is not provided below the partial region S2 of the lower in-pixel select transistor SLCT. As a result, the shape of the second photodiode regions PHD2 of the upper and lower pixels can be made the same.

In addition, in the cross-section A-B of FIG. 8, there is an N-type contact region FDN connected to the via M1C1, and a gate polysilicon layer of the reset transistor RST, an N-type contact region FDN of the via M1C1 connected to the reset voltage VR, a gate polysilicon layer of the source follower transistor SF, and an N-type contact region FDN0 are provided. The region R2 where the second photodiode region PHD2 is not formed corresponds with the source region S1 of FIG. 7. The source region S1 is connected by metal wiring (not shown) to the floating diffusion region FD.

As shown in the layout diagram of FIG. 7B, the floating diffusion regions FD1 and FD2 of the upper and lower pixels are connected to the gate electrode of the source follower transistor SF via a polysilicon layer POLY. Further, the source region of the source follower transistor SF is connected to the drain region of the select transistor SLCT via the polysilicon layer POLY. In addition, the source region of the select transistor SLCT is connected to the signal line SGL via a metal layer (not shown).

As shown in the layout diagram of FIG. 7B, the first and second photodiode regions PHD1 and PHD2 respectively that constitute the photodiode region are both provided spaced apart from the isolation trench structure STI2. This serves to prevent the flow of a leak current near the isolation trench structure STI2 as a dark current.

As shown in the layout diagram of FIG. 7C, the gate lines to the transfer gate transistors TG1 and TG2 and the gate line to the select transistor SLCT are constituted by means of a first metal layer M1L that extends in a horizontal direction. The first metal layer M1L is connected to the gate polysilicon layer of the two transistors. Further, the signal line SGL that is connected to the source region of the select transistor SLCT is constituted by a second metal layer M2L that extends in a vertical direction. Further, a light-shielding film OPS of the third metal layer M3L is formed over a region where the in-pixel photodiode regions PHD1 and PHD2 in the respective pixels are not formed. More particularly, by providing the light-shielding film OPS over the floating diffusion regions FD1 and FD2, the production of noise caused by incident light on the floating diffusion regions FD1 and FD2 is prevented. Further, the light-shielding film OPS of the third metal layer M3L is also formed over the source region Si of the reset transistor RST that is connected to the floating diffusion region FD1 and, likewise, the light-shielding film OPS is similarly formed over the source region S2 of the select transistor SLCT. In addition, the light-shielding film OPS of the third metal layer is also provided over the peripheral region between pixels. This serves to suppress crosstalk between pixels.

The light-shielding film OPS of the third metal layer in FIG. 7C has a shape with line symmetry with respect to the boundary line of the upper and lower pixels. As a result, incident light incidents on the upper and lower pixels extending over the same surface area, whereby inconsistencies in the detection signal between the two pixels can be eliminated. As also shown in the cross-sectional view in FIG. 8, the light-shielding film OPS is located above the region R1 where the floating diffusion region FD and transfer gate transistor TG are formed.

In addition, as shown in the layout diagram of FIG. 7A and the cross-sectional view of FIG. 8, the high-concentration P-type shield region P+ shield is formed between the first photodiode region PHD1 and substrate surface. As a result of the shield region, the silicon oxide film of the substrate surface and first photodiode region PHD1 are isolated and the photodiode region is completely buried. A dark current of the leak current of the silicon oxide film is suppressed by separating the photodiode region from the silicon oxide film of the substrate surface.

In the case of the first embodiment shown in FIG. 5, a floating diffusion region FD and transistors RST, SF, and SLCT are provided in the two pixels PX1 and PX2. However, the cross-sectional structure is the same as that in FIG. 8. That is, the photodiode region is constituted by the N-type first photodiode region PHD1 in the vicinity of the substrate surface and the N-type second photodiode region PHD2 buried in the substrate and the second photodiode region PHD2 is also buried below the transistors RST, SF, and SLCT but are not provided below the floating diffusion region FD and transfer gate transistor TG. Otherwise, the constitution is substantially the same as the cross-sectional structure of the second embodiment.

Process of the Second Embodiment

Figure 9:
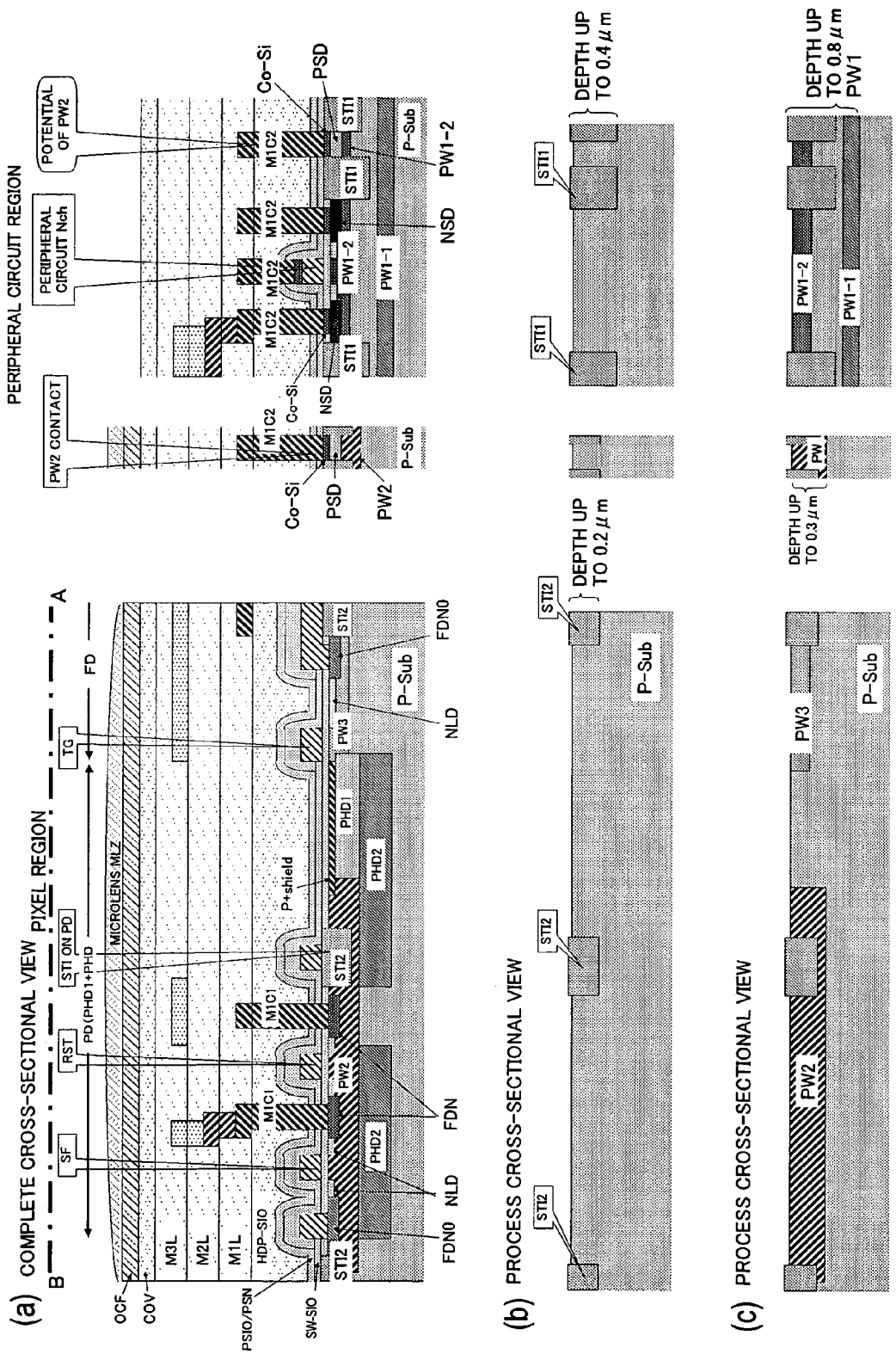
FIG. 9 is a cross-sectional view of the process steps of the second embodiment.
Figure 10:
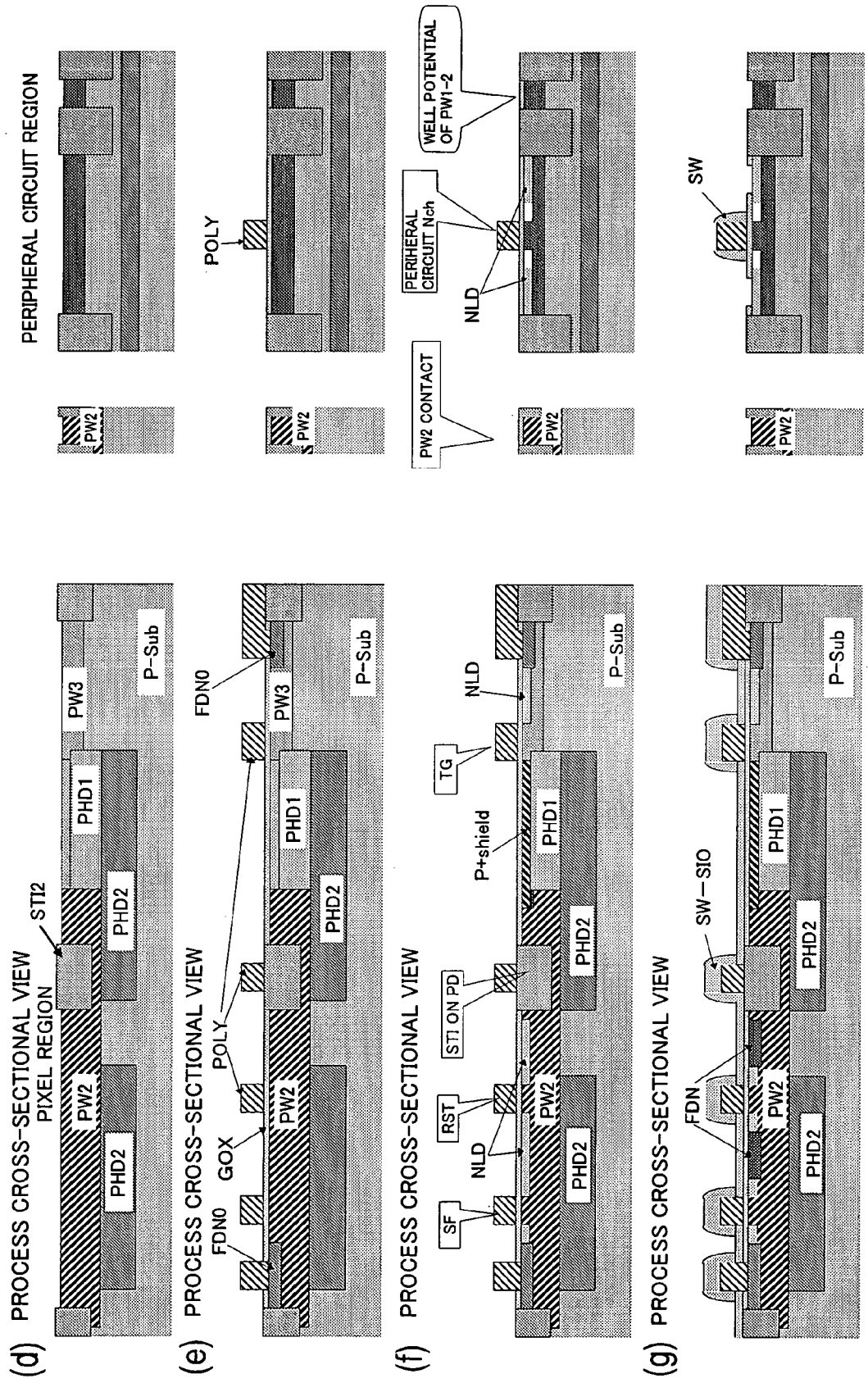
FIG. 10 is a cross-sectional view of the process steps of the second embodiment.
Figure 11:
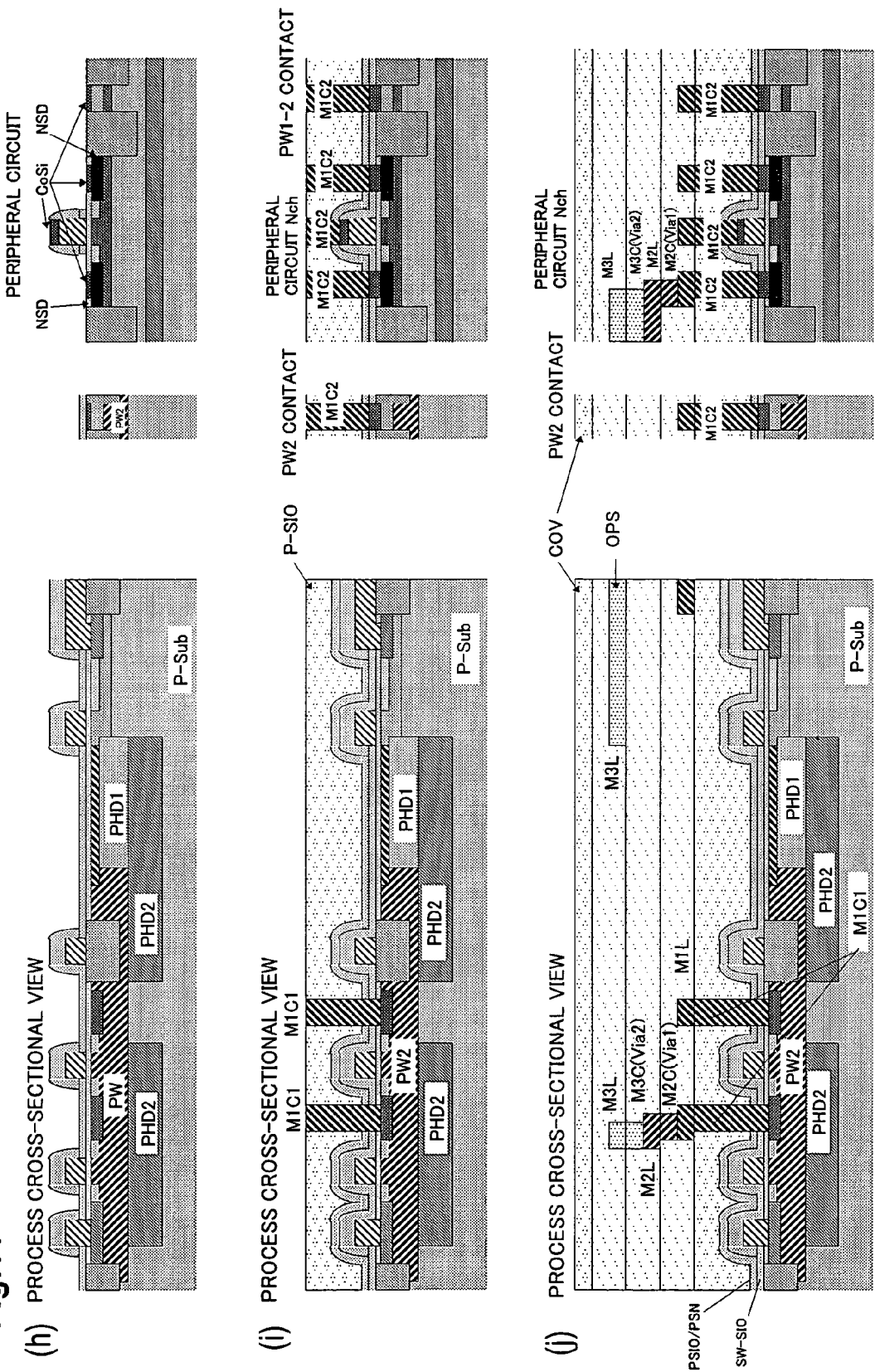
FIG. 11 is a cross-sectional view of the process steps of the second embodiment.

Next, FIGS. 9 to 11 are cross-sectional views showing the process steps of the second embodiment. The structural process of the image sensor is described. The structure of the image sensor will become more evident from a description of the fabrication process.

In the process (b) of FIG. 9, the element isolations STI1 and STI2 are formed in the peripheral circuit region and pixel region respectively in the surface of a P-type silicon substrate P-Sub. More specifically, in the peripheral circuit portion, etching of approximately 400 nm is performed on the silicon substrate and, in the pixel region, etching of approximately 200 nm is performed on the silicon substrate. A silicon oxide film is formed by means of high-concentration plasma CVD, chemical and mechanical polishing is performed, and a silicon oxide film is buried in the etched trench to form the element isolation structures STI1 and STI2. Here, the formation of the element isolation structure STI2 at a more shallow depth than the peripheral circuit region in the pixel region means that the depth of the second photodiode region PHD2 formed in the lower part of the read transistor in the pixel in subsequent step makes as shallow as possible so as to raise the light sensitivity.

In the process (c) of FIG. 9, ion implantation of the first P-type well region PW1 is performed in the peripheral circuit region. First, the P-type well region PW1-1 is formed deeply by means of boron B, energy 300 keV, concentration $3\times10^{13}$ $cm^{-2}$, and ion implantation with a tilt angle of 0 degrees. The P-type well region PW1 where the N channel transistor of the peripheral circuit is formed must have a high impurity concentration of about $3\times10^{13}$ $cm^{-2}$ in order to lower the resistance of the substrate. In addition, a shallow P-type well region PW1-2 is formed in the peripheral circuit portion by means of ion implantation with boron B, energy 30 keV, a concentration of approximately $5\times10^{12}$ $cm^{-2}$, and a tilt angle of 7 degrees. The ion implantation is performed in order to control the threshold voltage Vt of the N-channel transistor of the peripheral circuit.

On the other hand, in order to form the N-type well region (not shown) of the peripheral circuit, ion implantation with phosphorous P, energy 600 keV, a concentration of $3\times10^{13}$ $cm^{-2}$, and a tilt angle of 0 degrees, and ion implantation with arsenic AS, energy 160 keV, a concentration of 2 to $3\times10^{13}$ $cm^{-2}$, and a tilt angle of 7 degrees.

In addition, the second P-type well region PW2 of the pixel portion is formed. The second P-type well region PW2 is formed by means of ion implantation with boron B, energy 80 keV, a concentration of up to $3\times10^{13}$ $cm^{-2}$, and a tilt angle of 7 degrees. Further, ion implantation of the second P-type well region PW2 is not performed below the gate electrode of the transfer gate transistor TG and the floating diffusion region FD of the pixel portion. In addition, this ion implantation is implemented with an energy lower than implantation of the first P-type well region PW1-1 of the first peripheral circuit portion, so that the second P-type well region PW2 is formed more shallowly than the first P-type well region. As a result, the second photodiode region PHD2 that is subsequently formed can be formed shallowly.

Furthermore, the ion implantation of the second P-type well region PW2 is done for controlling the threshold voltage Vt of the read transistor in pixel.

In addition, a dedicated third P-type well region PW3 is formed for the in-pixel photodiode PD, transfer gate transistor TG, and floating diffusion region FD by means of ion implantation with boron B, energy of 30 keV, a concentration of $2\times10^{12}$ $cm^{-2}$, and a tilt angle of 7 degrees. This third P-type well region PW3 is formed by implanting boron B at a concentration that is half or less than half the threshold value control concentration of the peripheral circuit N-channel transistor in the former first well region PW1, thereby lowering threshold voltage Vt of transfer gate transistor TG. By lowering the threshold value voltage Vt of the transfer gate transistor TG, the charge transfer efficiency from the photodiode PF to the floating diffusion region FD can be increased. At the same time, by making the third P-type well region PW3 a higher concentration than the substrate concentration, the potential for to the electrons at the channel portion of the transfer gate transistor TG is increased and the saturation charge amount of the photodiode PD is then increased. Further, the third P-type well region PW3 has a lower impurity concentration than that of the second P-type well region PW2 and, as a result, the threshold voltage of the transfer gate transistor is controlled to a low level.

Process (d) in FIG. 10 performs ion implantation that forms a first photodiode region PHD1 in a pixel region. Ion implantation consists of ion implantation with phosphorous P, energy of 207 keV, a concentration of 1 to $2\times10^{12}$ $cm^{-2}$, and a tilt angle of 7 degrees, and ion implantation with phosphorous P, energy of 135 keV, a concentration of 1 to $2\times10^{12}$ $cm^{-2}$, and a tilt angle of 7 degrees. As a result of this ion implantation, the third P-type well region PW3 formed earlier is negated and the shallow-region first N-type diffusion region PHD1 constituting the photodiode PD is formed.

Thereafter, a second N-type diffusion region PHD2 (Deep Photo Diode) is formed by means of ion implantation with phosphorous P, energy of 325 keV, a concentration of 1 to $5 \times 10^{12}$ cm$^{-2}$, and a tilt angle of about 7 degrees by using a resist mask having an opening that overlaps the first photodiode region PHD1 and extends to below the isolation structure STI2 surrounding the region PHD1. This becomes the second photodiode region PHD2. The region of ion implantation is as shown in the layout diagram above. In the pixel region, the isolation structure STI2 is formed shallow and is formed shallower than the second P-type well region PW2. Therefore, the depth of the second photodiode region PHD2 can be made relatively shallow.

In process (e) in FIG. 10, a gate oxide film GOX of approximately 8 nm is formed on the substrate surface by means of thermal oxidation at about 800° C. and a polysilicon film POLY of about 180 nm is generated on the gate oxide film GOX by means of CVD. Further, ion implantation with phosphorous P, energy of 20 keV, a concentration of $4 \times 10^{15}$ cm$^{-2}$, and a tilt angle of 7 degrees is performed on the polysilicon film of the N-channel transistor part of the peripheral circuit and the polysilicon film of the pixel and the polysilicon film is doped to become an N-type polysilicon film by performing annealing at 800° C. for about 60 minutes. A gate electrode is then rendered by patterning a polysilicon film POLY.

Thereafter, in process (f) of FIG. 10, in the N-channel transistor part of the peripheral circuit and the pixel, ion implantation (LDD: Light Doped Drain implantation) with phosphorous, energy of 20 keV, a concentration of $4 \times 10^{13}$ cm$^{-2}$, and a tilt angle of 0 degrees is performed with the gate electrode serving as a mask, whereby source and drain regions NLD are formed.

Thereafter, a structure in which a shield diffusion layer P+ shield is formed and the N-type diffusion layer PHD1 of the photodiode PD is embedded is rendered by performing ion implantation with boron B, energy of 10 keV, a concentration up to $1 \times 10^{13}$ cm$^{-2}$, and a tilt angle of 7 degrees on the substrate surface where the in-pixel first photodiode region PHD1 is formed. That is, the first photodiode region PHD1 is a structure that is spaced apart from the oxide film of the substrate surface and a dark current that is caused by a leak current of the oxide film can be suppressed.

As a result of this constitution, the depth at which the light reception region of the photodiode is formed is as follows. In the first photodiode region PHD1, the diffusion layer PHD1 is formed at a shallow region close to the substrate surface and therefore the depletion layer of the photodiode extends to the deep side of the substrate from a depth of about 0.1 µm on the shallow side. On the one hand, in the second photodiode region PHD2, the second P-type well region PW2 has a depth of about 0.3 µm and therefore the depletion layer of the second photodiode region PHD2 extends from a depth of about 0.4 µm on the shallow side to the deep side of the substrate and extends to about 1.0 µm on the deep side. That is, the first photodiode region PHD1 is 0.1 to 0.4 µm and the second photodiode region PHD2 is 0.4 to 1.0 µn.

Therefore, when an approximation is made from the light transmission curves in the silicon, the ratio between the light sensitivity (per unit area) of the first photodiode region PHD1 and the light sensitivity (per unit area) of only the second photodiode region PHD2 is about up to 65% for red, up to 58% green, and up to 36% for blue. On the other hand, in cases where a deep first P-type well region PW1 is formed instead of the shallow second P-type well region PW2 in the pixel region and a similar second photodiode region PHD2 is formed below the deep first P-type well region PW1, the second photodiode region PHD2 is then at a depth of about 1.0 to 1.4 µm. In this case, the light sensitivity (per unit area) of the second photodiode region PHD2 is then 55% for red, 48% for green, and 14% for blue in comparison with the case with the shallow PHD2. That is, as per this embodiment, it can be understood that a more marked increase in light sensitivity is produced when the second photodiode region PHD2 is embedded below the shallow second P-type well region PW2.

In process (g) in FIG. 10, a sidewall SW is formed on the gate electrode of the peripheral circuit portion. Hence, a 100-nm silicon oxide film is formed through thermal oxidation, a resist that covers the in-pixel transistor and photodiode FD and the floating diffusion region FD is formed, and etching of the whole surface of the silicon oxide film is performed with the resist serving as a mask. As a result, the sidewall SW is formed at the gate electrode of the gate wiring to the transfer gate transistor and the gate wiring to the reset transistor of the pixel region and the peripheral circuit portion. Further, the sidewall silicon oxide film SW-SIO is retained within the pixel.

Thereafter, N-type ion implantation with phosphorous P, energy of 15 keV, and a concentration up to $2 \times 10^{15}$ cm$^{-2}$ of a high-concentration contact region FDN for the formation of contacts is performed on the source and drain regions of the in-pixel reset transistor RST and the source and drain regions of the source follower transistor SF.

In process (h) of FIG. 11, ion implantation with phosphorous P, energy of 13 keV, a concentration of $2 \times 10^{15}$ cm$^{-2}$, and a tilt angle of 7 degrees is performed in order to form high-concentration source and drain regions NSD in the N-channel transistor region of the peripheral circuit. Further, after processing a silicon substrate surface in hydrofluoric acid HF, cobalt Co is formed by means of sputtering and cobalt silicide CoSi is formed on the silicon surface on the source and drain region NSD and the gate electrode by means of rapid thermal annealing at up to 520° C. Further, the unreacted cobalt film on the silicon oxide film is removed and rapid thermal annealing at up to 840° C. is performed.

In process (i) of FIG. 11, an insulation film is formed and contact holes are formed. First, a silicon oxide film P-SIO formed through plasma CVD is formed up to approximately 20 nm and a silicon nitride film PSIN formed through plasma CVD is formed up to approximately 70 nm. A silicon oxide film HDP-SI0 formed through HDP-CVD (High Density Plasma CVD) is formed up to approximately 1000 nm on the two-layer insulation film and the surface is smoothed by means of CMP polishing. Further, a contact hole M1C1 is formed in the region FDN for performing in-pixel contact implantation. Further, a contact hole for the in-pixel P-type well region PW2 and a contact hole M1C2 in the peripheral circuit are formed. At the same time, a contact hole M1C2 for the P-type well region PW1 is also formed. Further, the contact hole M1C2 is a contact hole for the region where cobalt silicide CoSi (formed earlier) is formed and the silicide becomes an etching stopper. Hence, formation is by means of a process that is different from the contact hole M1C1.

In process (j) in FIG. 11, a contact hole is embedded by forming titanium Ti (up to 30 nm) and titanium nitride TiN (up to 50 nm) through sputtering after contact opening and depositing a tungsten W film (up to 300 nm) by means of CVD, the three-layer film Ti/TiN/W of the surface is removed through CMP polishing, and a tungsten plug is formed in the contact hole. Thereafter, first metal wiring M1L is formed by means of sputter film deposition of Ti(up to 30 nm)/TiN(up to 50 nm)/Al(up to 400 nm)/Ti(up to 5 nm)/TiN(up to 50 nm) and photoetching processes.

Further, an interlayer insulation film that is made over the first metal wiring M1L is formed by means of the deposition of an HDP plasma oxide film HDP-SI0 (up to 750 nm) and a plasma oxide film P-SI0 (up to 1100 nm) and CMP polishing. A via Vial is formed in the interlayer insulation film and a W plug in the via Vial and second metal wiring M2L are formed by means of the same processes as for the formation of a W plug for the contact and the formation of the first metal wiring.

In addition, third metal wiring M3L is formed to render a light-shielding film OPS. The light-shielding film OPS is formed in a region as shown in FIG. 7C. A cover film COV is finally formed and, as shown in (a) of FIG. 9, an optical color filter OCF and microlens MLZ are formed on the cover film COV.

As detailed above, the photodiode region is constituted by a first region PHD1 that extends in the depth direction from the vicinity of the substrate surface and a second region PHD2 that is laid below the P-type well region PW2 where the in-pixel transistor is formed. The second region PHD2 is not provided below the floating diffusion region FD and the transfer gate transistor TG. In addition, the P-type well region PW3 where the floating diffusion region FD and transfer gate transistor TG are formed are afforded a lower concentration, whereby the junction capacitance of region FD is reduced and the threshold voltage of the transistor TG can be made lower than that for another transistors.

Third Embodiment

Figure 12:
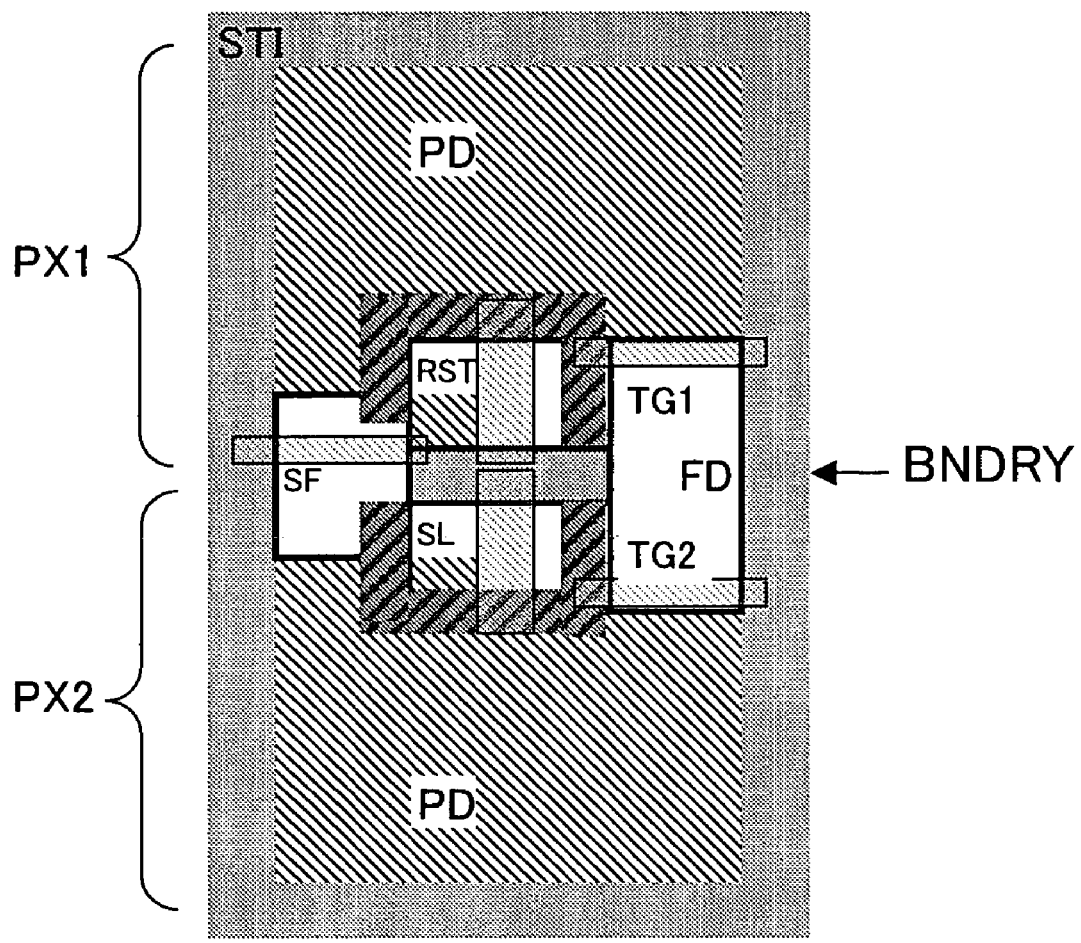
FIG. 12 is a layout diagram of pixels of a third embodiment.

FIG. 12 is a layout diagram of pixels of the third embodiment. Like the second embodiment of FIG. 6, the two upper and lower pixels PX1 and PX2 share the floating diffusion region FD and the transistors RST, SF, and SL. The third embodiment differs from the second embodiment in that a photodiode region PD with a diagonal pattern is not formed below the source follower transistor SF, the source follower transistor SF is disposed on the pixel boundary line BNDRY, and the reset transistor RST and select transistor SL are arranged above and below the boundary line. Because the photodiode region PD (PHD2) is not provided below the source follower transistor SF, it is possible to reduce the substrate bias effect by the photodiode region PD to the P-type well region PW2 constituting the channel region of the transistor SF.

Further, the layout of the transistors TG, RST, SL, and SF has line symmetry with respect to the boundary line BNDRY, the pixel layout is uniform, and inconsistencies in the detection signal can be eliminated. The remaining constitution is the same as that of the second embodiment.

Fourth Embodiment

Figure 13:
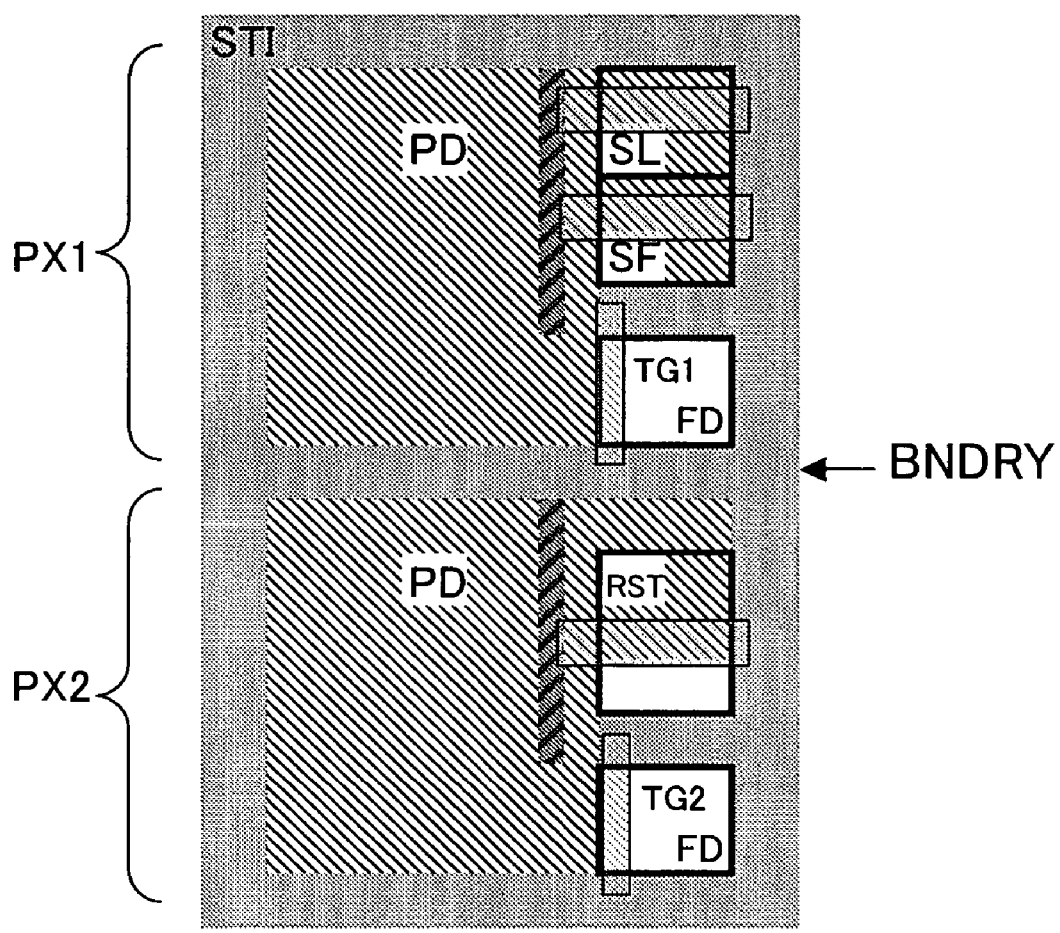
FIG. 13 is a layout diagram of pixels of a fourth embodiment.

FIG. 13 is a layout diagram of pixels of a fourth embodiment. In this layout, the floating diffusion region FD, transfer gate transistor TG1, source follower transistor SF, and select transistor SL are arranged along the right-hand isolation structure STI in the first pixel PX1 and the floating diffusion region FD, transfer gate transistor TG2, and reset transistor RST are arranged along the right-hand isolation structure STI in the second pixel PX2. That is, similarly to the second embodiment, the floating diffusion region FD and transistors RST, SF, and SL are shared by the two pixels.

Further, the photodiode region PD is disposed in the region expect for the region below the floating diffusion region FD and transfer gate transistors TG1 and TG2. Further, the photodiode region PD is not formed below the source region of the reset transistor RST. In addition, the floating diffusion regions FD in the respective pixels are shared or common by being mutually connected by means of metal wiring or the like.

The merit of the layout is that the layout of the upper and lower pixels do not have line symmetry and have substantially the same shape. Therefore, even when there is directionality in the process inconsistencies, the inconsistencies between pixels are the same.

Fifth Embodiment

Figure 14:
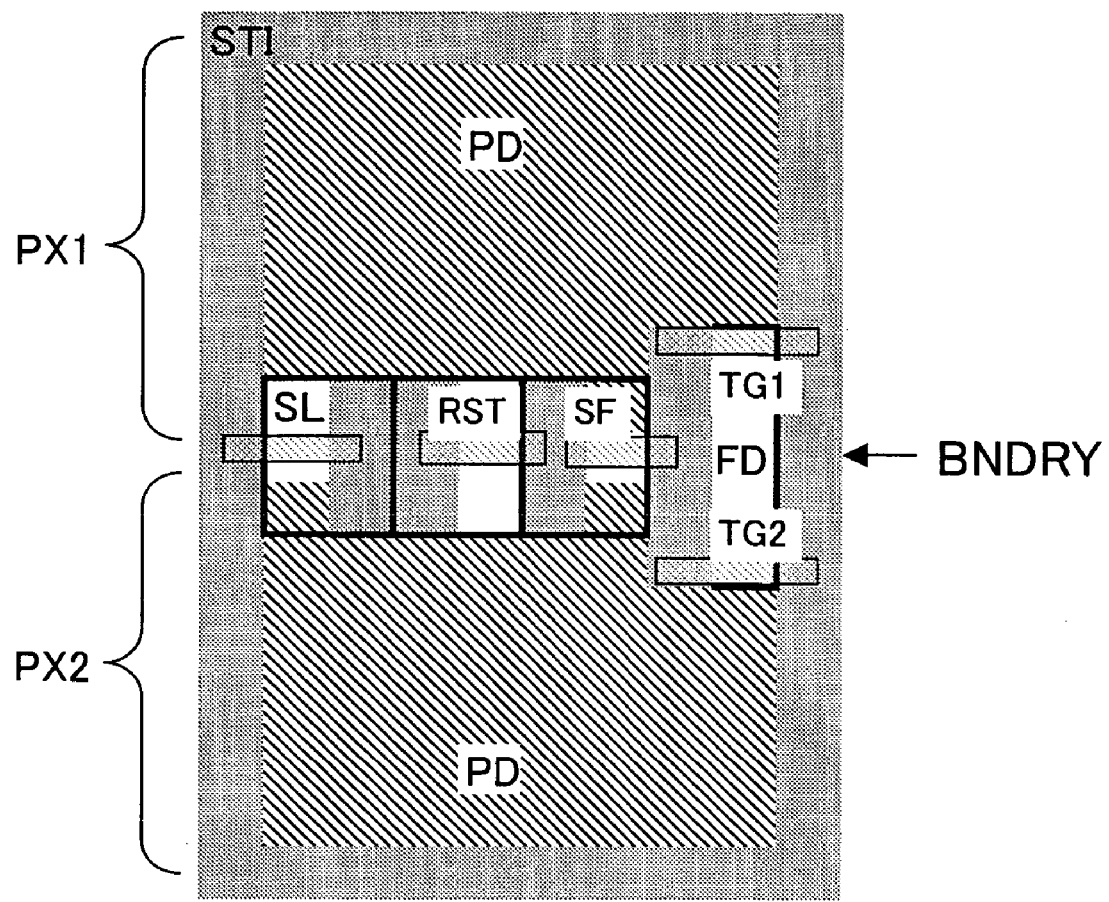
FIG. 14 is a layout diagram of pixels of a fifth embodiment.

FIG. 14 is a layout diagram of pixels of a fifth embodiment. In this layout, the source follower transistor SF, reset transistor RST, and select transistor SL stand in a row on the pixel boundary line BNDRY and are isolated by the three isolation structures STI on the boundary line BNDRY. Further, an isolation structure STI is not formed in the region where the photodiode region FD is formed. That is, the floating diffusion region FD and transistors SF, RST, and SL that are shared between the pixels are all arranged on the boundary line BNDRY and the transfer gate transistors TG1 and TG2 that are individually provided in each pixel are provided adjacent above and below the floating diffusion region FD.

The buried region PHD2 that constitutes the photodiode region PD does not overlap the isolation structure STI and, therefore, the influence of a leak current that is produced in the vicinity of the isolation structure STI can be eliminated and a dark current can be suppressed. The photodiode regions PD are laid out with line symmetry with the boundary line BNDRY interposed therebetween. Further, the photodiode regions PD are not provided below the region FD, the transistors TG1 and TG2, and the source regions of the reset transistor RST.

Figure 15C:
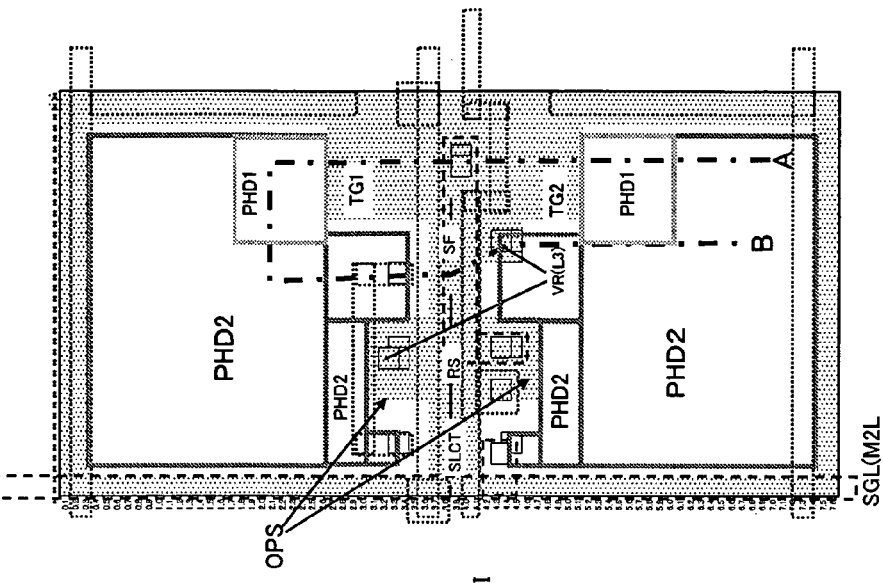
FIG. 15 is a detailed layout diagram of pixels of the fifth embodiment.
Figure 15B:
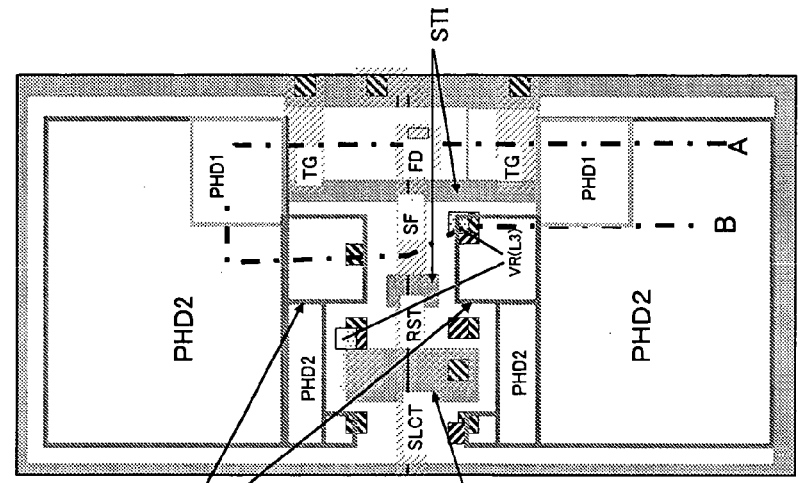
Figure 15A:
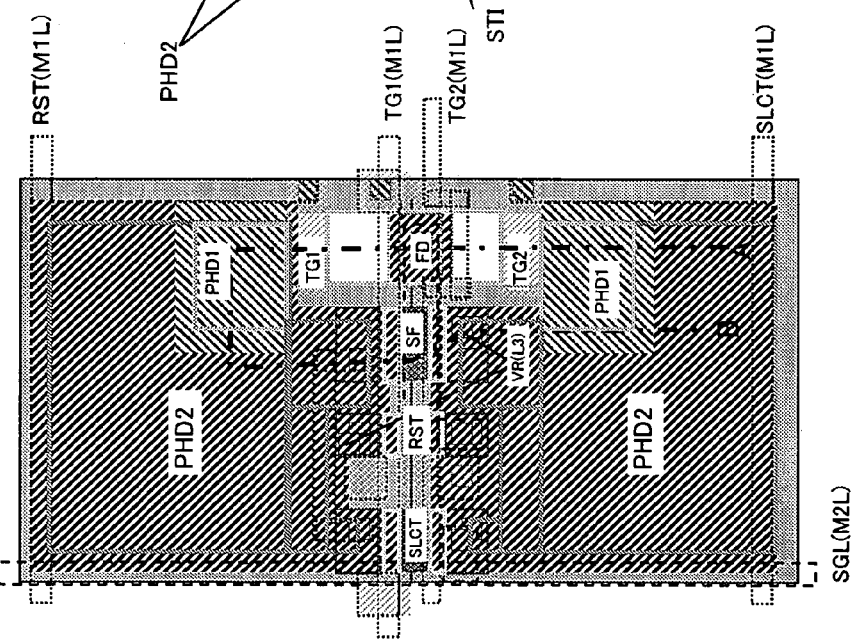

FIG. 15 is a detailed layout diagram of pixels of the fifth embodiment. Like FIG. 7, FIG. 15A shows a layout diagram showing a structure with all the layers except for the third metal layer. FIG. 15B shows a layout diagram showing an isolation trench structure, photodiode region PD, and the polysilicon gate of each transistor. FIG. 7C shows a layout diagram showing the photodiode region PD and the third metal layer M3L.

Similarly to FIG. 14, a common floating diffusion region FD, source follower transistor SF, reset transistor RST, and select transistor SLCT are arranged on the boundary line of the upper and lower pixels. However, the floating diffusion region FD is provided in each pixel and is shared by being connected by a polysilicon layer. As shown in the detailed diagram 15B, the isolation structure STI that isolates the transistors is provided on the boundary line and the buried second photodiode region PHD2 is not provided below the isolation structure STI. In addition, second photodiode regions PHD2 are also disposed below a partial region of the select transistor SLCT and the source follower transistor SF. Further, the second photodiode region PHD2 is shown by means of a plurality of squares but is actually formed by means of the same ion implantation.

Figure 16:
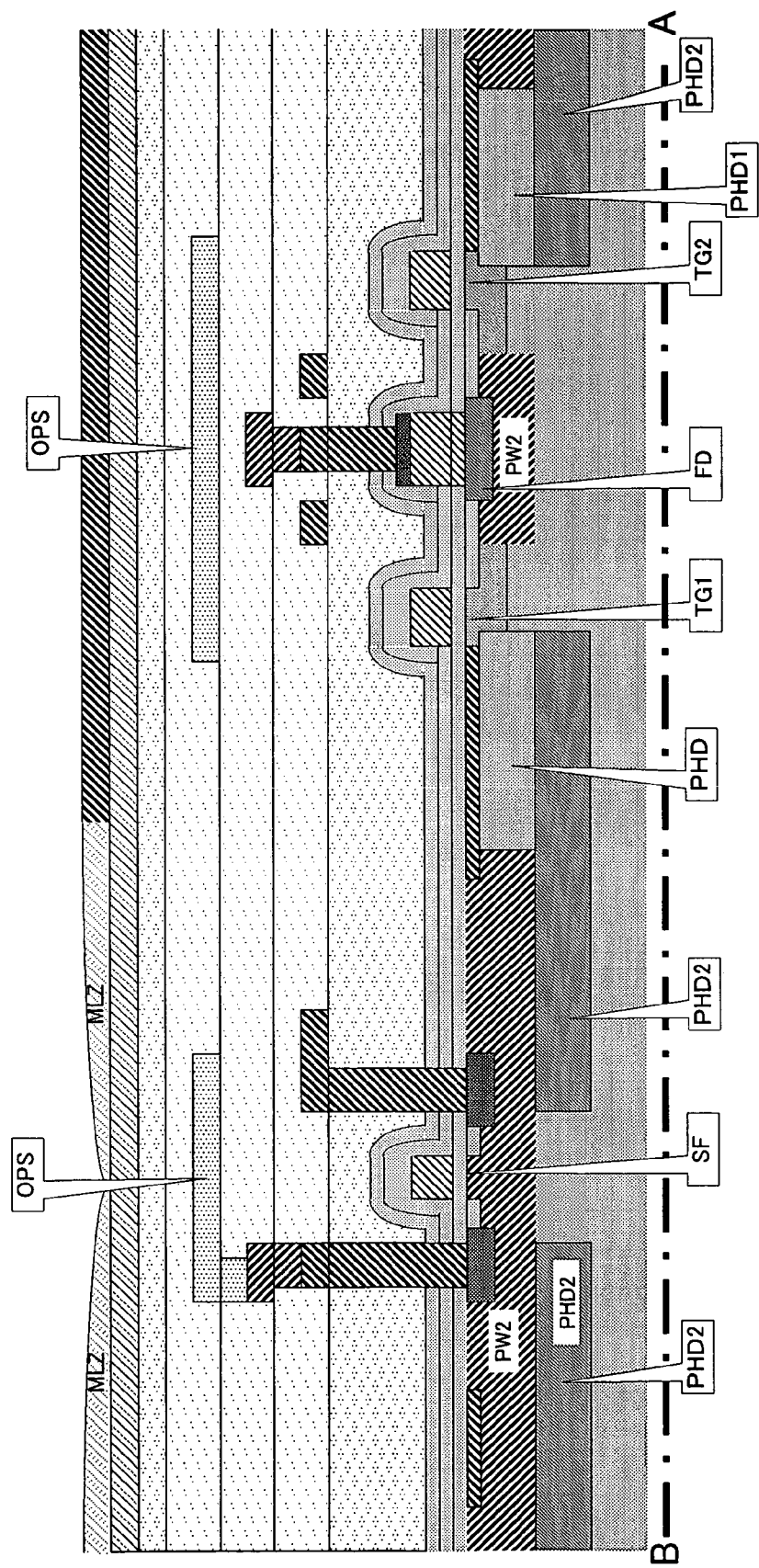
FIG. 16 is a detailed cross-sectional view of pixels of the fifth embodiment.

FIG. 16 is a detailed cross-sectional view of pixels of the fifth embodiment and is a cross-sectional view along the line A-B in FIG. 15. As is evident from the cross-sectional view, the buried second photodiode region PHD2 does not overlap the in-pixel isolation structure STI. Further, the second photodiode region PHD2 is not provided below a partial region of the floating diffusion region FD, transfer gate transistor TG, and source follower transistor SF.

Sixth Embodiment

FIG. 17 is a layout diagram of pixels of the sixth embodiment. This layout differs from that of FIG. 14 in that the photodiode regions PD are not embedded below the source follower transistor SF. Otherwise, the layout is the same.

Seventh Embodiment

Figure 18:
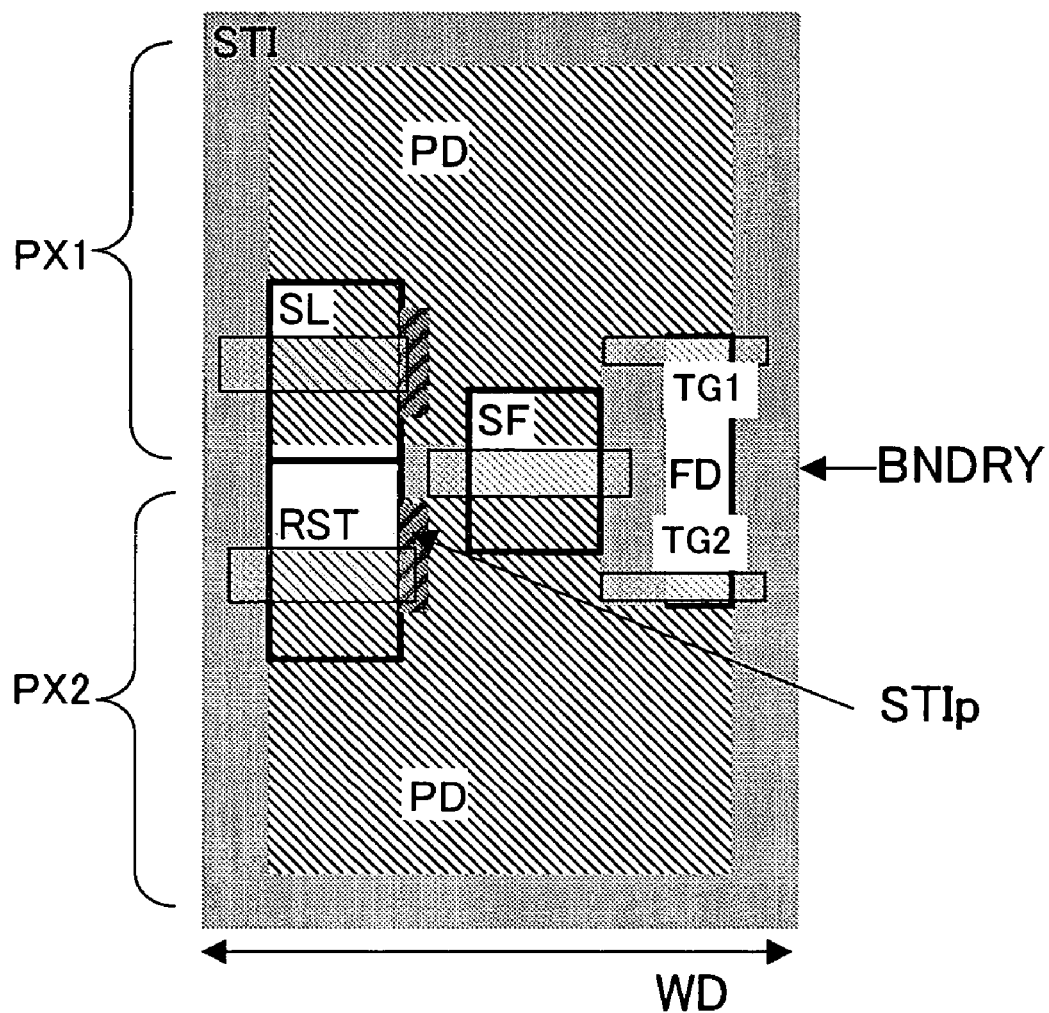
FIG. 18 is a layout diagram of pixels of a seventh embodiment.

FIG. 18 is a layout diagram of pixels of a seventh embodiment. In this layout, the floating diffusion region PD and source follower transistor SF are arranged above the boundary line BNDRY and the reset transistor RST and select transistor SL are arranged along the left side of the pixels. As a result, the width WD in the lateral direction of the pixel can be narrowed and, accordingly, the isolation structure STIp is only formed in the pixel.

Further, the photodiode region PD is not embedded below the channel of the source follower transistor SF. As a result, the substrate bias effect to the transistor SF can be suppressed, fluctuations in the threshold value can be eliminated, and inconsistencies in the detection signal can be dispensed with.

Figure 19C:
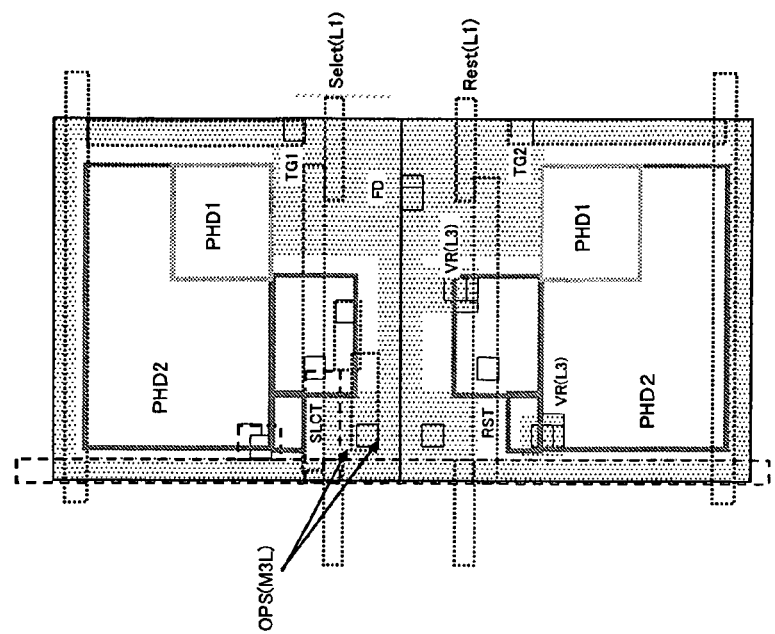
FIG. 19 is a detailed layout diagram of pixels of the seventh embodiment.
Figure 19B:
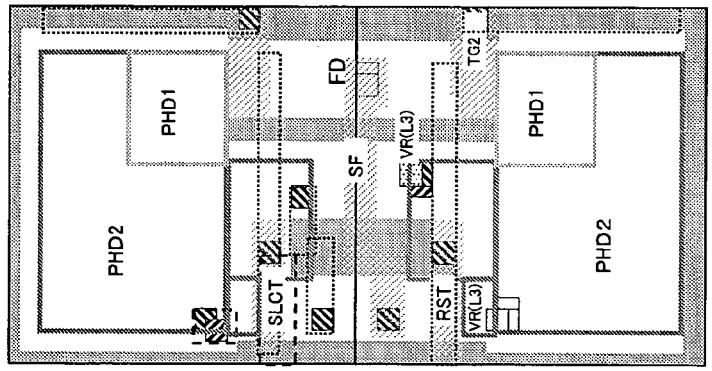
Figure 19A:
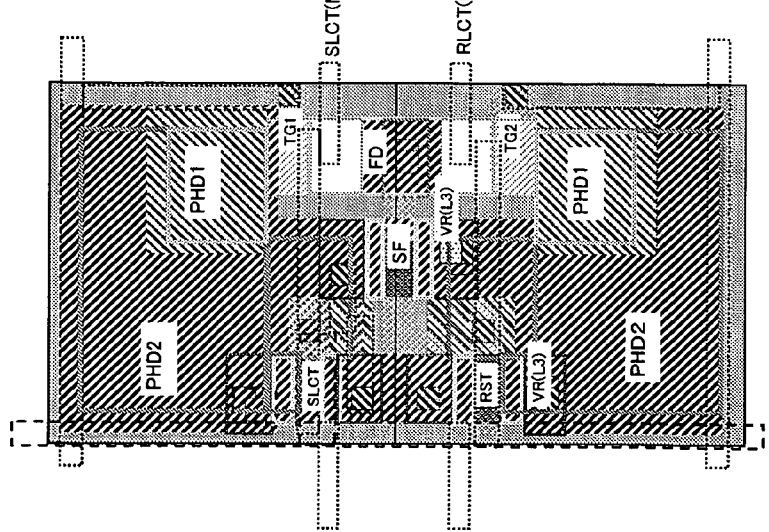

FIG. 19 is a detailed layout diagram of pixels of the seventh embodiment. As shown in FIG. 19C, in addition to being disposed on the floating diffusion region FD, the light-shielding film OPS of the third metal wiring M3L is also disposed in the region where the floating diffusion regions FHD1 and FHD2 are not provided.

Eighth Embodiment

Figure 20:
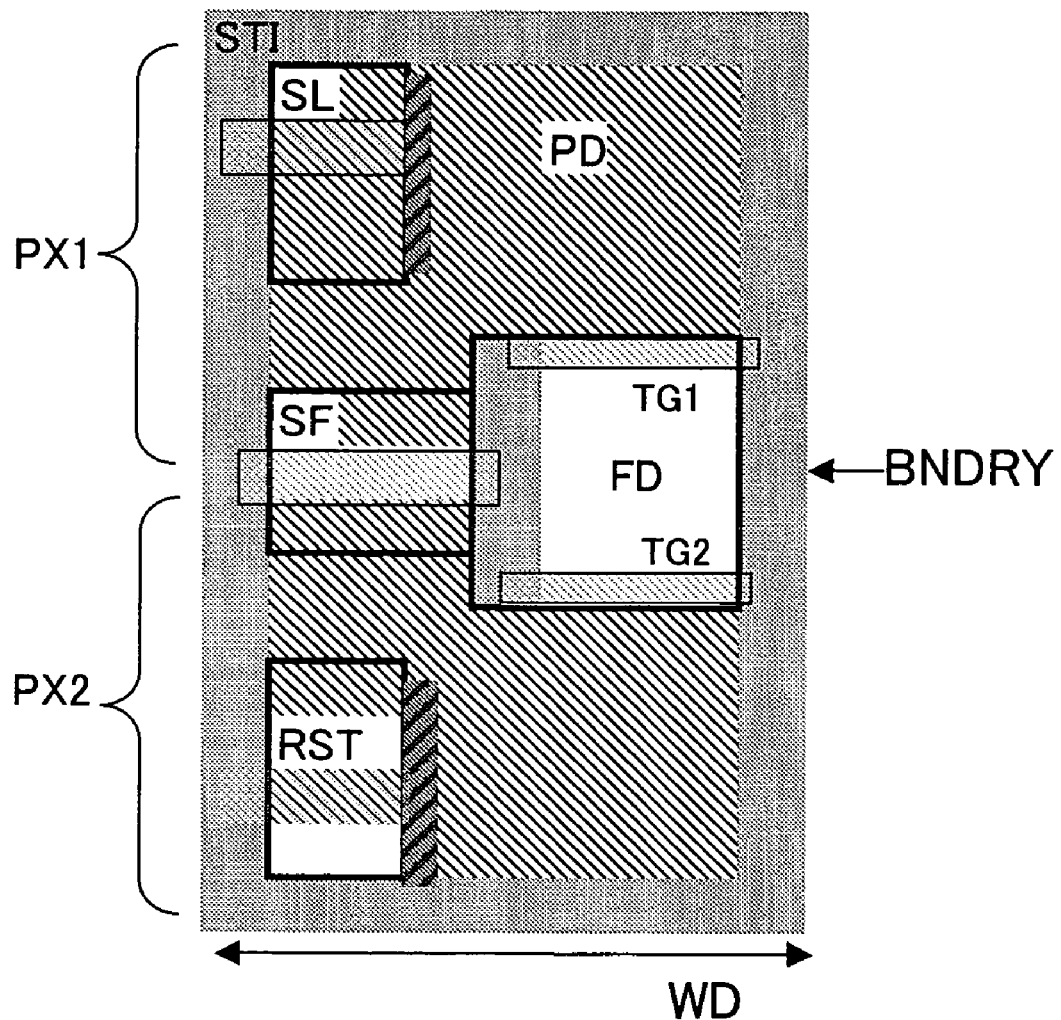
FIG. 20 is a layout diagram of pixels of an eighth embodiment.

FIG. 20 is a layout diagram of pixels of the eighth embodiment. In this layout, the floating diffusion region FD and source follower transistor SF are arranged on the boundary line BNDRY and the source follower transistor SL and reset transistor RST are arranged along the left side of the pixel above and below the source follower transistor SF. By arranging the transistors SL and RST above and below the transistor SF, the width WD in the lateral direction of the pixel can be further narrowed. Alternatively, the surface area of the floating diffusion region FD and source follower transistor SF and so forth can be increased.

Ninth Embodiment

Figure 21:
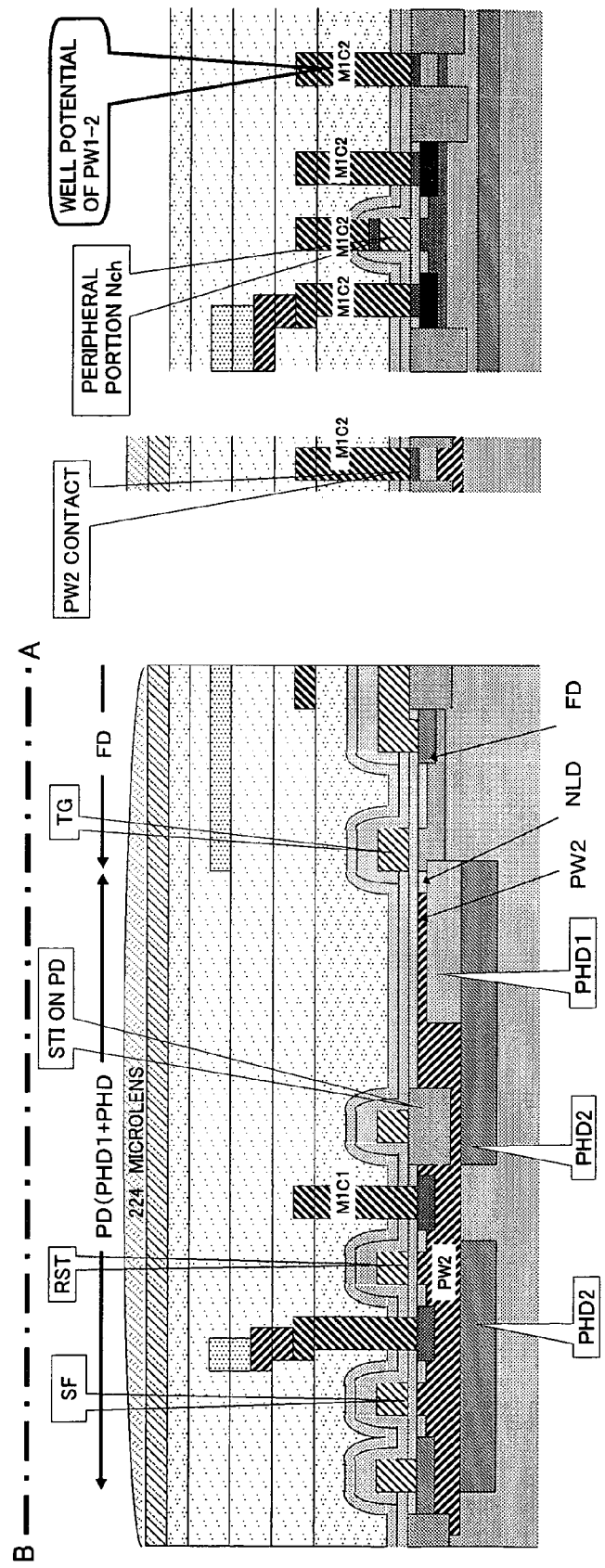
FIG. 21 is a cross-sectional view of pixels of a ninth embodiment.

FIG. 21 is a cross-sectional view of pixels of the ninth embodiment. The layout of the pixels is the same as that in the second embodiment in FIG. 6. However, as shown in this cross-sectional view, the P-type shield region between the first photodiode region PHD1 and the substrate surface is not provided. Further, N-type lightly doped drain regions NLD are formed on both sides of the transfer gate transistor TG. Because there is no P-type shield region, the lightly doped drain regions NLD are disposed in the vicinity of the gate electrode and, as a result, the transfer efficiency of the transfer gate transistor TG can be raised.

As shown in FIG. 21, if a constitution in which the photodiode regions PHD1 and PHD2 need not be completely embedded by being spaced apart from the substrate surface is used, this constitution can also be applied to a three-transistor-type APS. The three-transistor-type APS has a constitution in which the transfer gate transistor of the four-transistor-type APS is not provided and the cathode (N-type region) of the photodiode FD also serves as the floating diffusion region, wherein the cathode is connected to the reset transistor.

Tenth Embodiment

Figure 22:
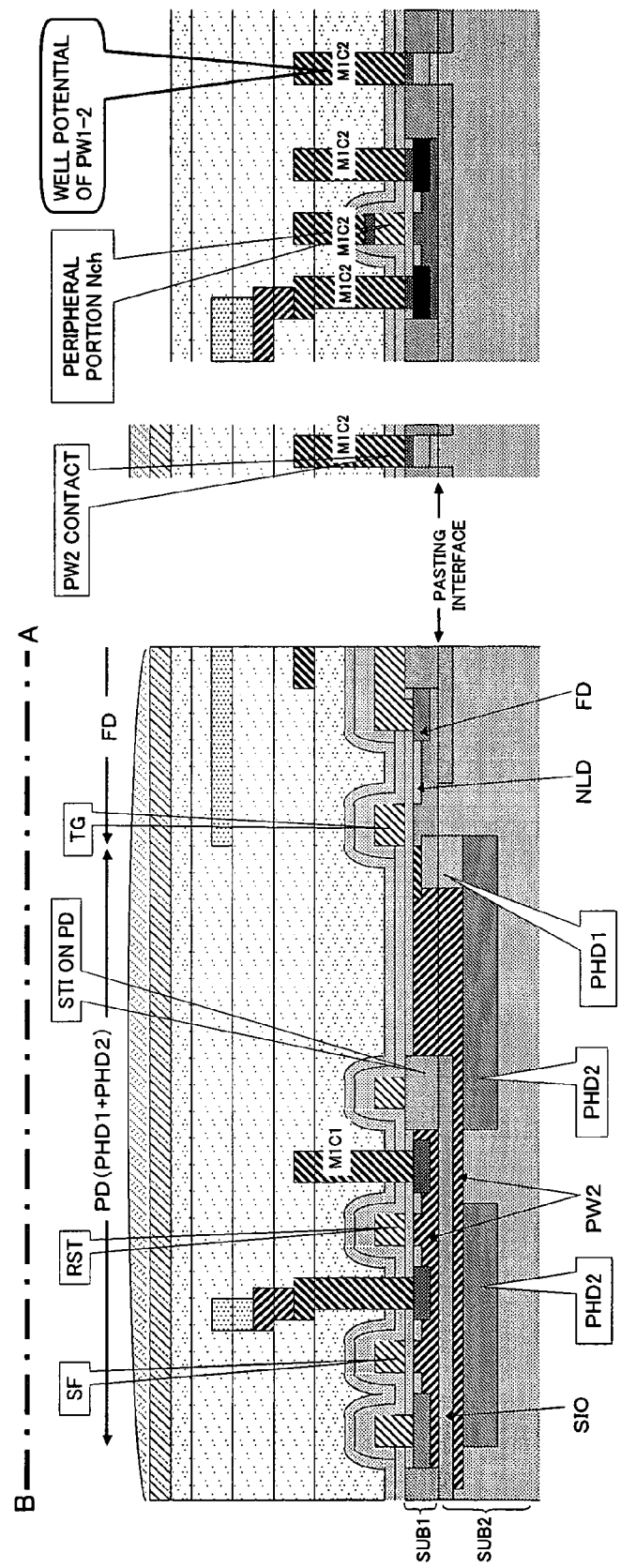
FIG. 22 is a cross-sectional view of pixels of a tenth embodiment.

FIG. 22 is a cross-sectional view of pixels of a tenth embodiment. The layout of the pixels is the same as that of the second embodiment in FIG. 6. However, the cross-sectional structure has a constitution that separates the P-type well region PW2 where the transistors RST and SF are formed and the buried second photodiode region PHD2 by means of an in-substrate silicon oxide film SIO. As a result, the P-type well region PW2 where the transistors RST and SF are formed is not subject to the influence of the potential of the second photodiode region PHD2 and the substrate bias effect. Therefore, fluctuations in the threshold voltage of the transistors RST and SF can be suppressed. Accordingly, fluctuations in the threshold voltage of the transistors RST, SF, and SLCT are suppressed according to the amount of electrical charge that has accumulated in the photodiode region PHD2, whereby the accuracy of the detection signal can be raised.

The in-substrate silicon oxide film SIO can be formed by means of a method of performing ion implantation deep below the substrate surface and, as shown in FIG. 22, by means of a method that pastes together a substrate SUB1 where the transistor is formed and a substrate SUB2 on whose surface the silicon oxide film SIO is formed.

Eleventh Embodiment

Figure 23:
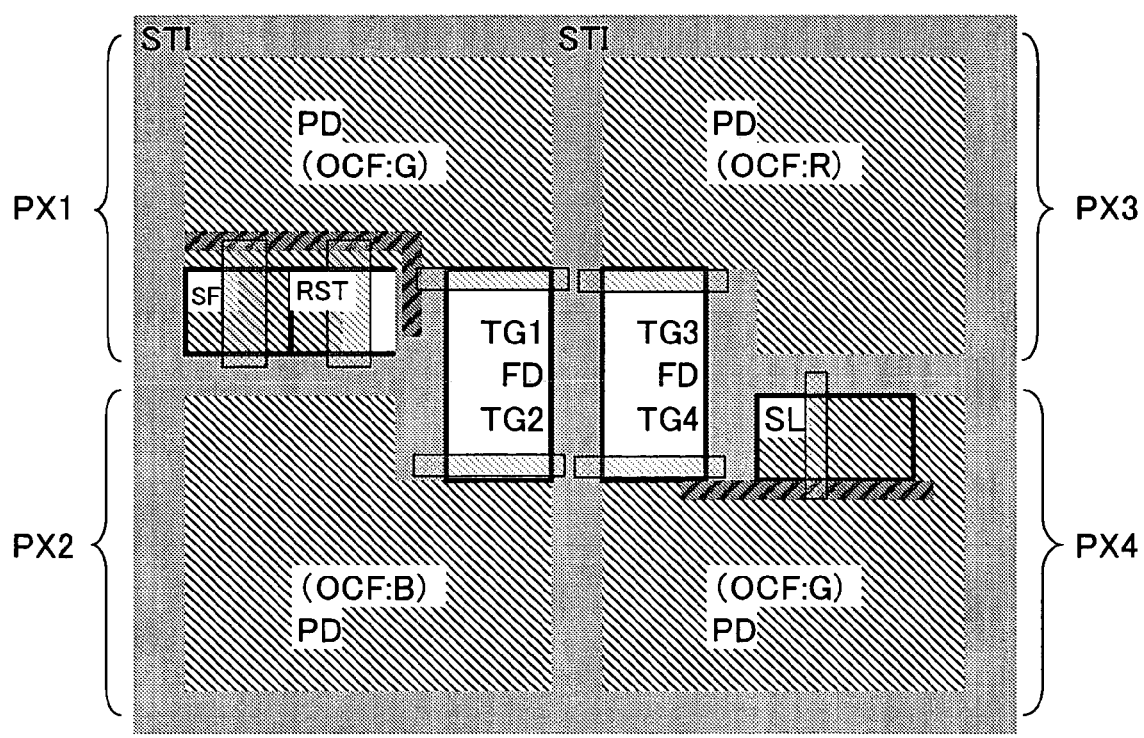
FIG. 23 is a layout diagram of pixels of an eleventh embodiment.

FIG. 23 is a layout diagram of pixels of the eleventh embodiment. In the eleventh embodiment, four adjacent pixels PX1 to PX4 share the transistors RST, SF, and SL and share a floating diffusion region FD. The pixels PX1 and PX2 share the floating diffusion region FD on the boundary line of the pixels PX1 and PX2, respective transfer gate transistors TG1 and TG2 being arranged above and below the floating diffusion region FD. Further, the reset transistor RST and source follower transistor SF are provided in the pixel PX1. Further, the pixels PX3 and PX4 share the floating diffusion region FD on the boundary line between the pixels PX3 and PX4, respective transfer gate transistors TG3 and TG4 being arranged above and below the floating diffusion region FD. Further, the select transistor SL is provided in the pixel PX4.

So too in this embodiment, the photodiode regions PD in the respective pixels are laid except below the floating diffusion region FD and the transfer gate transistor TG. However, the photodiode region PD is not laid below the source region of the reset transistor RST that is connected to the floating diffusion FD.

In this embodiment, four in-pixel photodiode regions PD are formed in a pattern with point symmetry. That is, the regions PD of the pixels PX1 and PX4 have the same shape and the regions PD of the pixels PX2 and PX3 have the same shape. A Bayer-array optical filter is provided on the respective pixels. Because the regions PD of the pixels PX1 and PX4 are narrow, the optical filters formed on the regions PD are all green G. On the other hand, a blue B or red R optical filter is provided on the pixel PX2 and a red R or blue B optical filter is provided on the pixel PX3. Because the transmittance of a green G optical filter is generally high in comparison with the other colors, the green G optical filter is preferably provided on pixels PX1 and PX4 with a narrow photodiode region for the sake of balance with the other colors B and R. An optical filter with low transmittance such as a blue B or red R optical filter is provided on pixels PX2 and PX3 with a wide photodiode region.

Twelfth Embodiment

Figure 24:
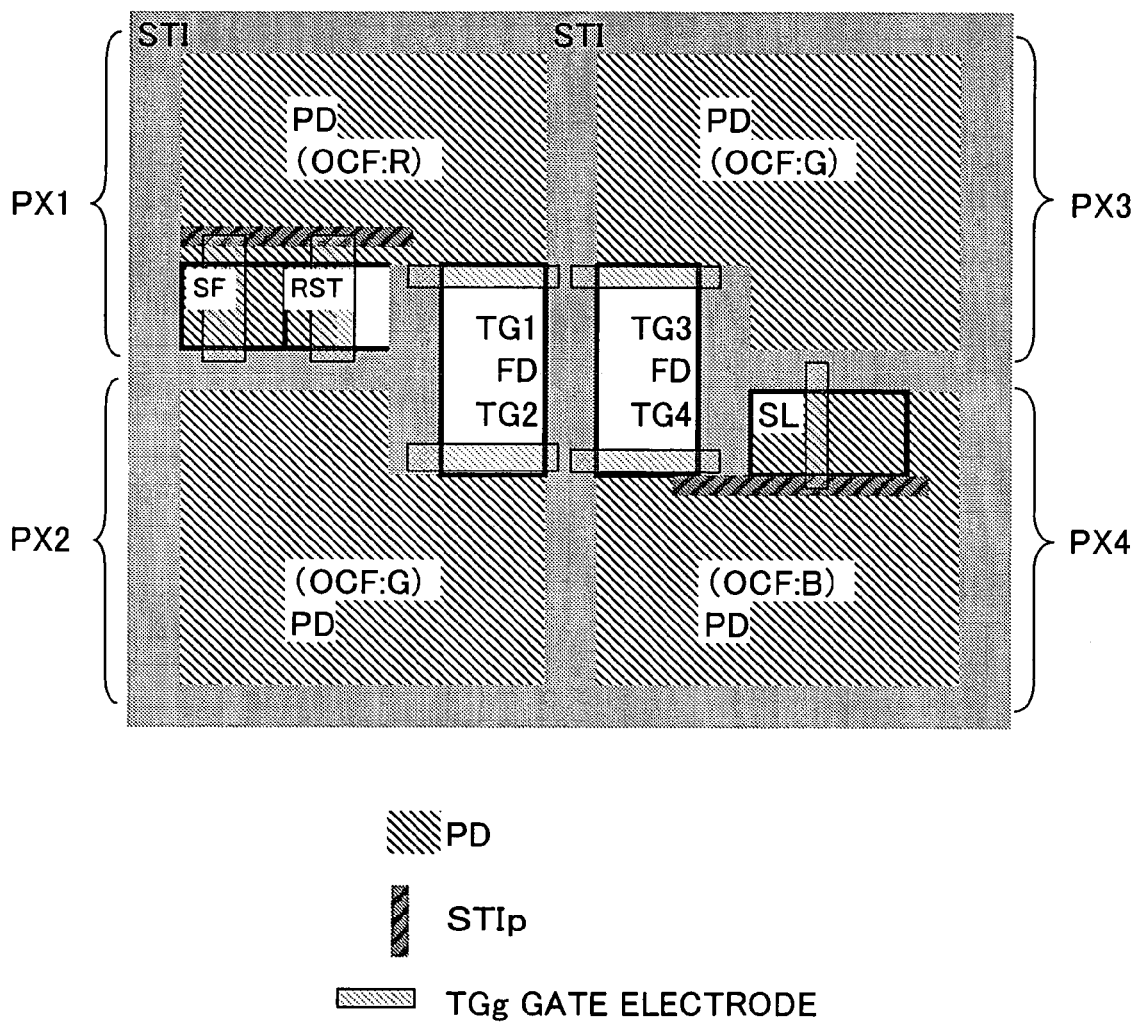
FIG. 24 is a layout diagram of pixels of a twelfth embodiment.

FIG. 24 is a layout diagram of pixels of the twelfth embodiment. This layout is the same as that of the eleventh embodiment in FIG. 23, only the array of RGB optical filters being different. In this example, a green G optical filter is disposed on the pixels PX2 and PX3 and a red R or blue B optical filter is disposed on the pixels PX1 and PX4. By providing a green G optical filter on the pixels PX2 and PX3 with a wide photodiode region PD, the light sensitivity of green that exerts the most influence on the luminance signal can be increased and the characteristics of a Bayer array can be exploited. More particularly, the luminance values in the event of a dark image can be increased.

Thirteenth Embodiment

Figure 25:
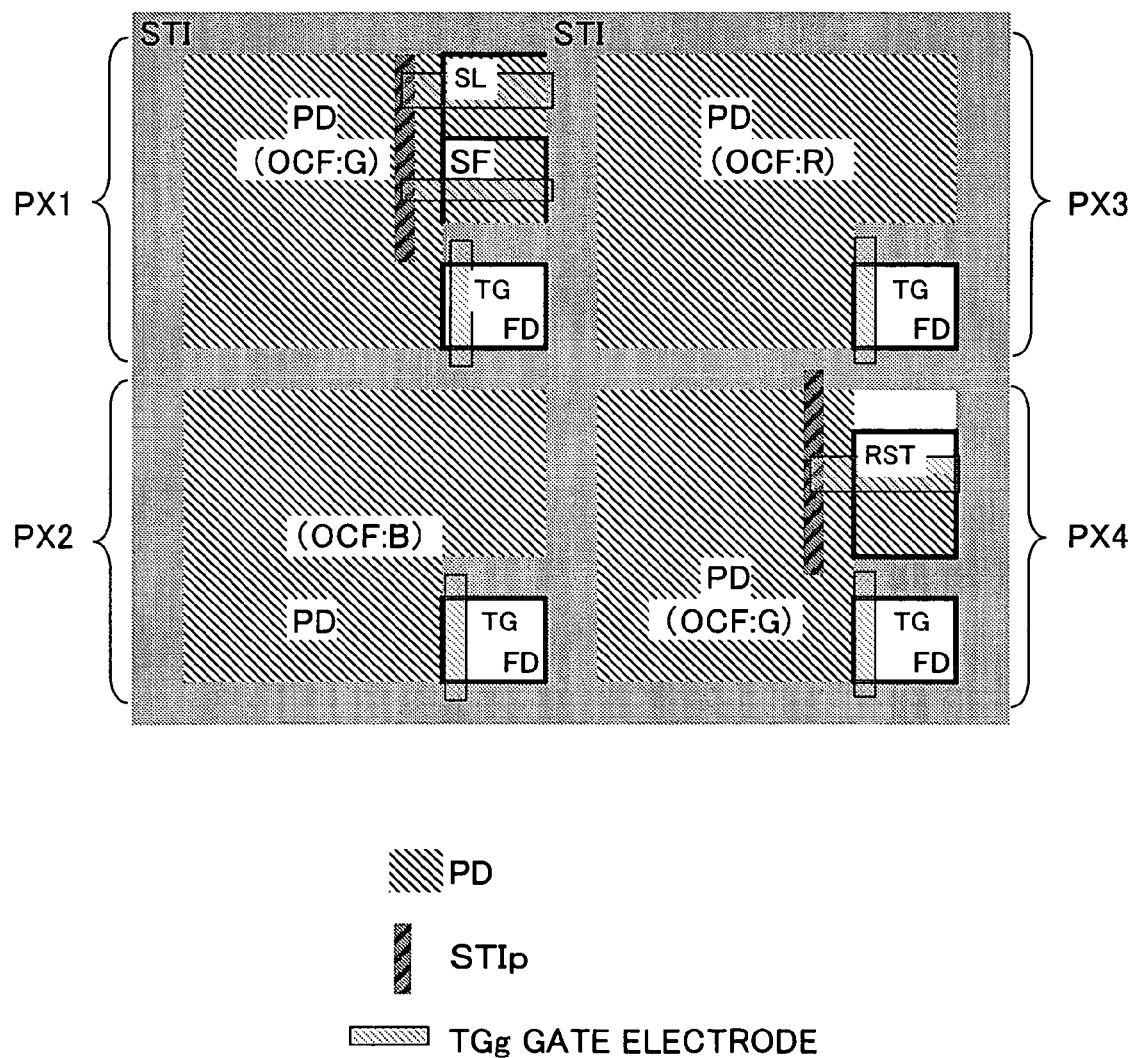
FIG. 25 is a layout diagram of pixels of a thirteenth embodiment.

FIG. 25 is a layout diagram of pixels of the thirteenth embodiment. The transistors are also shared by four pixels in this layout. However, the pixels PX1 and PX4 have the same layout as the pixels PX1 and PX2 of the fourth embodiment shown in FIG. 13, only the floating diffusion region FD and transfer gate transistor TG being arranged on the pixels FX2 and FX3. That is, the respective floating diffusion regions FD are formed in the respective pixels and are shared or made common as a result of being connected by means of wiring (not shown).

This layout example does not possess point symmetry, and the photodiode regions of the first to fourth pixels are located in a same direction with respective transfer gate in the same pixel. When processing inconsistencies arise in a horizontal direction, each pixel obtains the same inconsistencies and unbalance between pixels does not occur. Further, in the case of a Bayer array of an optical filter, pixels PX1 and PX4 are green G and pixels PX2 and PX3 are blue B or red R, for example. Alternatively, pixels PX1 and PX4 may be blue B or red R and pixels PX2 and PX3 may be green G.

Fourteenth Embodiment

Figure 26A:
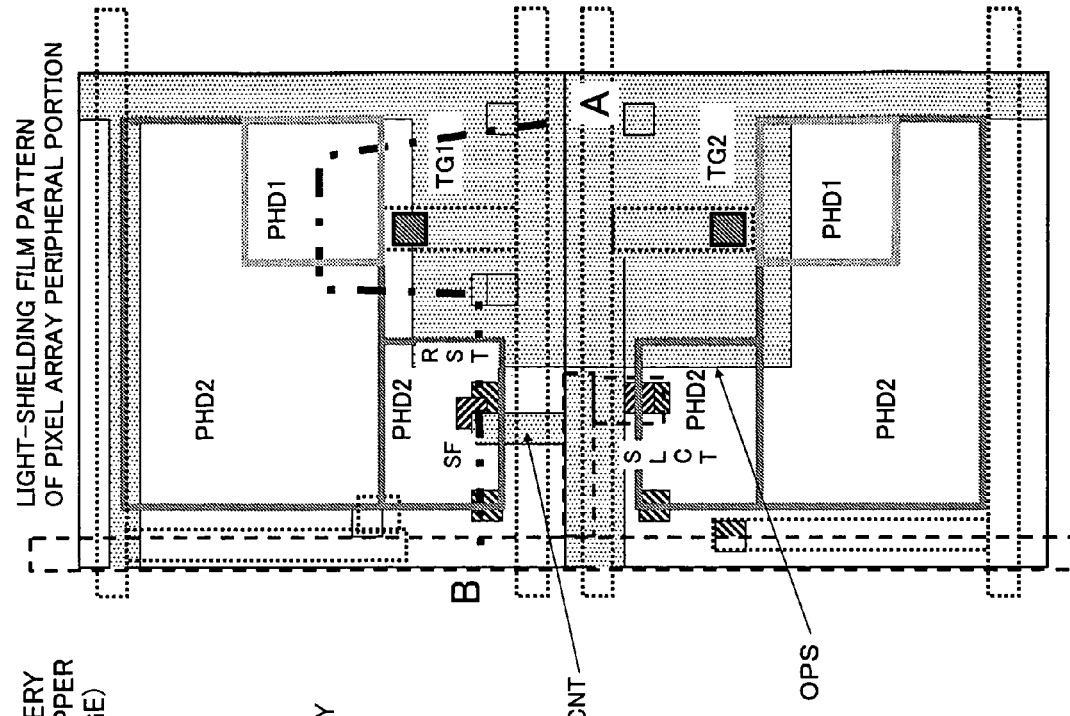
FIG. 26 is a layout diagram of pixels of a fourteenth embodiment.
Figure 26B:
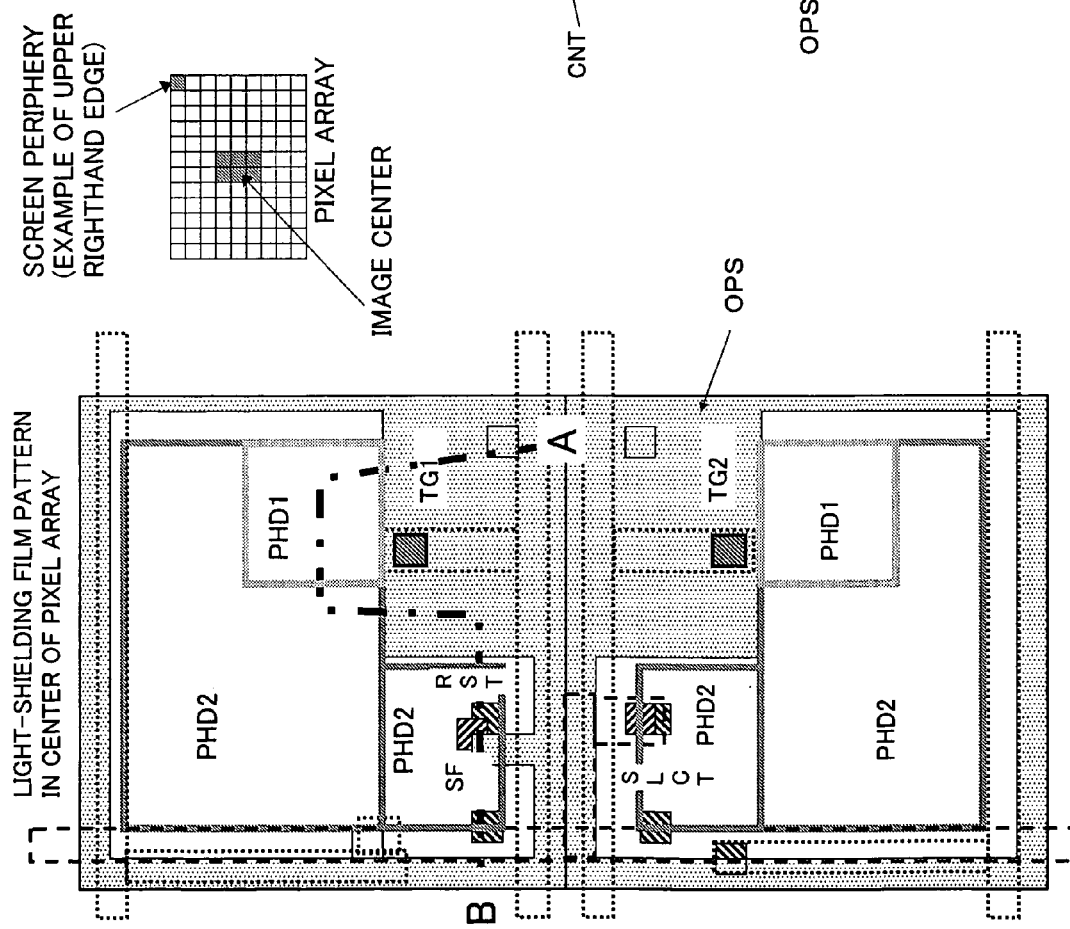

FIG. 26 is a layout diagram of pixels of the fourteenth embodiment. In FIG. 26, FIG. 26A shows a light-shielding film pattern in the middle of the pixel array and FIG. 26B shows a light-shielding film pattern in the periphery of the pixel array. Because light falls incident from right overhead on the pixels close to the center of the pixel array, the light-shielding film OPS is formed in the same pattern as for the in-substrate layout. That is, as shown in FIG. 26A, the light-shielding film OPS is arranged right above the floating diffusion region FD, the transfer gate transistor TG, and the source region of the reset transistor RST. On the other hand, the light falls incident inclined toward the center position in the peripheral portion of the pixel array and, therefore, the light-shielding film OPS is also disposed in a position that is shifted further toward the center than for the in-substrate layout. That is, as shown in FIG. 26B, the light-shielding film OPS of the pixels on the upper right edge is disposed shifted down toward the left. However, the contact pattern CNT is disposed without being shifted down toward the left in accordance with the in-substrate layout.

Fifteenth Embodiment

Figure 27:
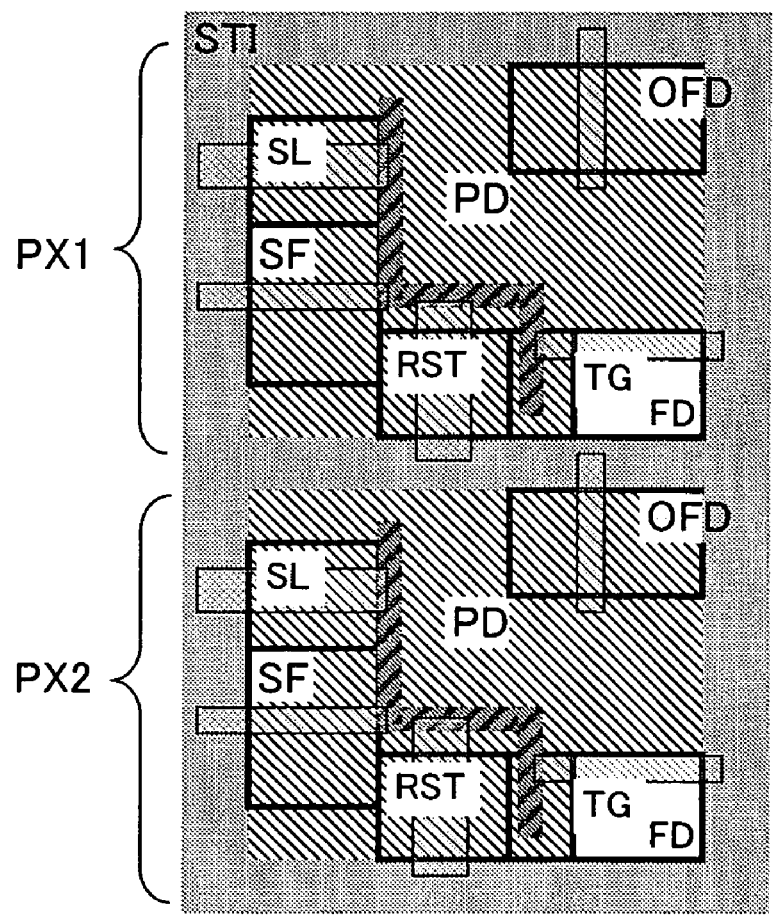
FIG. 27 is a layout diagram of pixels of a fifteenth embodiment.

FIG. 27 is a layout diagram of pixels of the fifteenth embodiment. In this embodiment, the present invention is applied to a five-transistor-type APS in which an overflow drain transistor OFD is provided in the pixel. Hence, each pixel contains a floating diffusion FD, a transfer gate transistor TG, a reset transistor RST, a source follower transistor SF, a select transistor SL, and an overflow drain transistor OFD. Further, the photodiode region PD is also buried below the transistor except below the floating diffusion region FD and transfer gate transistor TG.

Further, in the case of the five-transistor-type APS, the overflow drain transistor OFD is provided between the cathode terminal and reset voltage line of the photodiode PD. Electrical charge that has undergone photoelectric conversion by the photodiode PD can be taken from the cathode terminal by causing the transistor OFD to conduct and electrical charge can be made to accumulate at the cathode terminal by rendering the transistor OFD non-conductive. Therefore, the start timing of the integral time of all the pixels of the pixel array can be controlled so provide the so-called global shutter function. Thus, even when the number of in-pixel transistors increases, because the photodiode region PD can be extended to below the in-pixel transistors, a drop in the aperture ratio can be avoided.

The above embodiment illustrates an example in which a cross-sectional structure consisting of transistor and photodiode is created by a normal ion implantation method but there is no need for insistence on the fabrication method. That is, the cross-sectional structure may be created by pasting together a wafer 1 provided with a structure of a shallow part for the transistors and PD and a wafer 2 in which a deep PD part is provided by using a SOI (Silicon on Insulator) pasting technique. In this case, by suitably selecting the conditions, obtaining cross-sections like those in FIGS. 8, 16, and 22 can be easily inferred.

In addition, when an SOI pasting technique is used, in the photodiode region below the transistor formation region, an insulation film such as an oxide film is retained between the transistor formation region and the lower photodiode region and the fact that it is possible to reinforce the insulation between the transistors and lower photodiode can be easily inferred. Further, the constitution can also be implemented by using the Simox technique (separation by implantation of oxygen) in place: of the SOI pasting technique.

What is claimed is:

1. An image sensor having a plurality of pixels each having at least a photodiode, a transfer gate transistor, a reset transistor, and a source follower transistor,
wherein, in the pixels, a floating diffusion region constituting a node connecting the transfer gate transistor and reset transistor is connected to a gate of the source follower transistor; and
the pixels comprise a photodiode region that is embedded below the reset transistor and source follower transistor, the photodiode region being formed except below at least a partial region of the floating diffusion region.

2. The image sensor according to claim 1, wherein the photodiode region comprises:
a first photodiode region of a second conductivity type that extends in the depth direction from close to the substrate surface of a first conductivity type; and
a second photodiode region of the second conductivity type that is embedded to extend below the reset transistor and source follower transistor from the first photodiode region,
wherein the second photodiode region is formed except below at least a partial region of the floating diffusion region.

3. The image sensor according to claim 1, wherein, in the pixels, the photodiode region is formed except below at least a partial region of the transfer gate transistor.

4. An image sensor according to claim 1, wherein adjoining first and second pixels share at least the reset transistor, floating diffusion region, and source follower transistor, the photodiode regions of the first and second pixels being formed except below at least a partial region of the shared floating diffusion region.

5. The image sensor according to claim 1, wherein a light-shielding film that blocks incident light is formed on the floating diffusion region.

6. The image sensor according to claim 1, wherein the reset transistor comprises:
   a drain region that is connected to a reset voltage line and a source region that is connected to the floating diffusion region;
   the photodiode region is formed except below the source region of the reset transistor; and
   a light-shielding film that blocks incident light is formed on the source region.

7. The image sensor according to claim 4, wherein the photodiode region comprises:
   a first photodiode region of a second conductivity type that extends in the depth direction from close to the substrate surface of a first conductivity type; and
   a second photodiode region of the second conductivity type that is embedded to extend below the reset transistor and source follower transistor from the first photodiode region,
   wherein the second photodiode region is formed except below at least a partial region of the floating diffusion region.

8. The image sensor according to claim 7, wherein the second photodiode region is formed except below the source follower transistor of the first and second pixels.

9. The image sensor according to claim 7, further comprising:
   a select transistor that is connected to the source follower transistor and shared by the first and second pixels,
   wherein, in each of the first and second pixel regions, the transfer gate transistor and floating diffusion region and either one or two of the reset transistor, source follower transistor, and select transistor are provided along a side that is perpendicular to the boundary line of the first and second pixel regions; and
   the second photodiode regions in the first and second pixels have the same shape with the boundary line interposed therebetween.

10. The image sensor according to claim 7, wherein the shared floating diffusion region is formed on a boundary line of the first and second pixel regions and the transfer gate transistors are formed in the first and second pixel regions adjacent to the shared floating diffusion region; and
   the second photodiode regions in the first and second pixels have line-symmetrical shapes with the boundary line interposed therebetween.

11. The image sensor according to claim 10, further comprising:
   a select transistor that is connected to the source follower transistor and shared by the first and second pixels,
   wherein the shared reset transistor, source follower transistor, and select transistor are formed on both sides of the boundary line and on the boundary line; and
   the second photodiode regions in the first and second pixels are embedded below any of the reset transistor, source follower transistor, and select transistor.

12. The image sensor according to claim 10, further comprising:
   a select transistor that is connected to the source follower transistor and shared by the first and second pixels,
   wherein the reset transistor, source follower transistor and select transistor are provided on the boundary line via an in-substrate isolation trench structure; and
   the second photodiode region is formed in a region excluding the isolation trench structure in the first and second pixel regions.

13. The image sensor according to claim 11, wherein the second photodiode region is formed except below the source follower transistor.

14. The image sensor according to claim 10, further comprising:
   a select transistor that is connected to the source follower transistor and shared by the first and second pixels,
   wherein the source follower transistor is formed on the boundary line and the reset transistor and select transistor are provided on both sides of the boundary line.

15. The image sensor according to claim 10, further comprising:
   a select transistor that, is connected to the source follower transistor and shared by the first and second pixels,
   wherein the source follower transistor is formed on the boundary line and the reset transistor and select transistor are provided in the respective pixel regions on both sides of the source follower transistor.

16. The image sensor according to claim 7, wherein, in the respective pixel regions, a shield region of a first conductivity type is formed between the first photodiode region and substrate surface.

17. The image sensor according to claim 7, wherein each pixel region comprises a first conductivity-type well region in which the reset transistor and source follower transistor are formed; and
   the first conductivity-type well region is interposed between the substrate surface and the second photodiode region.

18. The image sensor according to claim 7, wherein, in each pixel region, a drain region of a first conductivity-type of the transfer gate transistor is formed between the first photodiode region and substrate surface.

19. The image sensor according to claim 7, wherein each pixel region comprises a first conductivity-type well region in which the reset transistor and source follower transistor are formed,
   wherein an insulation film is formed between the first conductivity-type well region and the second photodiode region.

20. An image sensor having a plurality of pixels each having at least a photodiode, a transfer gate transistor, a reset transistor, a source follower transistor, and a select transistor,
   wherein, in the pixels, a floating diffusion region constituting a node connecting the transfer gate transistor and reset transistor is connected to a gate of the source follower transistor;
   the pixels comprise a photodiode region that is embedded below the reset transistor, source follower transistor, or select transistor;
   adjoining first to fourth pixels share the reset transistor, source follower transistor, and select transistor;
   the first and second pixels share a first floating diffusion region and the third and fourth pixels share a second floating diffusion region, the photodiode regions of the respective pixels being formed except below at least a partial region of the shared floating diffusion regions;
   the first floating diffusion region is formed at the boundary of the first and second pixels and the second floating diffusion region is formed at the boundary of the third and fourth pixels; and
   respective transfer gate transistors are provided on both sides of the first or second floating diffusion region in the first to fourth pixels.

21. The image sensor according to claim 20, wherein the shared reset transistor, source follower transistor, and select transistor are provided in first and fourth pixels that do not adjoin one another via a side; and a green color filter is formed on the first and fourth pixels, and red and blue color filters are formed on the second and third pixels respectively.

22. The image sensor according to claim 20, wherein the shared reset transistor, source follower transistor, and select transistor are provided in first and fourth pixels that do not adjoin one another via a side; and a green color filter is formed on the second and third pixels, and red and blue color filters are formed on the first and fourth pixels respectively.

23. The image sensor according to any of claims 20 to 22, wherein the photodiode regions of the first to fourth pixels have a shape that is point-symmetrical with respect to the center of the first to fourth pixels respectively.

24. An image sensor having a plurality of pixels each having at least a photodiode, a transfer gate transistor, a reset transistor, a source follower transistor, and a select transistor, wherein, in the pixels, a floating diffusion region constituting a node connecting the transfer gate transistor and reset transistor is connected to a gate of the source follower transistor;

the pixels comprise a photodiode region that is embedded below the reset transistor, source follower transistor, or select transistor, and wherein adjoining first to fourth pixels share the reset transistor, source follower transistor, and select transistor;

the floating diffusion region and transfer gate transistor adjoining the floating diffusion region are formed in the first to fourth pixels respectively;

either one or two of the reset transistor, source follower transistor, and select transistor are provided in the first and fourth pixels that do not adjoin one another via a side respectively; and the photodiode regions of the first to fourth pixels are located in a same direction with respective transfer gate in the same pixel.

25. The image sensor according to claim 5, wherein a light-shielding film in a pixel region of a peripheral portion of a pixel array is disposed shifted toward the center portion in comparison with the light-shielding film in the pixel region of the center portion of the pixel array in which a plurality of pixels are arranged.

26. The image sensor according to claim 1, wherein an overflow drain transistor is disposed in a pixel.

* * * * *